(12) United States Patent
King et al.

(10) Patent No.: US 11,824,133 B2
(45) Date of Patent: Nov. 21, 2023

(54) DETECTION USING SEMICONDUCTOR DETECTOR

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Ya-Chin King, Taipei (TW); Chrong Jung Lin, Hsinchu (TW); Burn Jeng Lin, Hsinchu (TW); Shi-Jiun Wang, Changhua (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 17/670,309

(22) Filed: Feb. 11, 2022

(65) Prior Publication Data
US 2023/0026707 A1    Jan. 26, 2023

Related U.S. Application Data

(60) Provisional application No. 63/224,796, filed on Jul. 22, 2021.

(51) Int. Cl.
*H01L 31/119*    (2006.01)
*H01L 31/0224*    (2006.01)

(52) U.S. Cl.
CPC .... *H01L 31/119* (2013.01); *H01L 31/022408* (2013.01)

(58) Field of Classification Search
CPC ............... H01L 31/119; H01L 31/022408
See application file for complete search history.

(56) References Cited

U.S. PATENT DOCUMENTS 6,297,644 B1 * 10/2001 Jarvis .................. G01R 31/309
324/763.01
7,635,843 B1 * 12/2009 Luo ........................ H01L 22/12
250/307

(Continued)

FOREIGN PATENT DOCUMENTS

TW        202101764 A        1/2021

OTHER PUBLICATIONS

H. Choi et al., "High resolution short defect localization in advanced FinFET device using EBAC and EBIRCh," 2017 IEEE 24th International Symposium on the Physical and Failure Analysis of Integrated Circuits (IPFA), Chengdu, China, 2017, pp. 1-4, doi: 10.1109/IPFA.2017.8060090 (Year: 2017).*

*Primary Examiner* — Sitaramarao S Yechuri
(74) *Attorney, Agent, or Firm* — Maschoff Brennan

(57) ABSTRACT

A device includes a semiconductor fin, an isolation structure, a gate structure, source/drain structures, a sensing contact, a sensing pad structure, and a reading contact. The semiconductor fin includes a channel region and source/drain regions on opposite sides of the channel region. The isolation structure laterally surrounds the semiconductor fin. The gate structure is over the channel region of the semiconductor fin. The source/drain structures are respectively over the source/drain regions of the semiconductor fin. The sensing contact is directly on the isolation structure and adjacent to the gate structure. The sensing pad structure is connected to the sensing contact. The reading contact is directly on the isolation structure and adjacent to the gate structure.

20 Claims, 25 Drawing Sheets

(56) References Cited

U.S. PATENT DOCUMENTS

| | | |
|---|---|---|
| 11,588,037 B2 | 2/2023 | Nidhi et al. |
| 2008/0315196 A1* | 12/2008 | Aghababazadeh .......................... G01R 31/3025 257/E23.179 |
| 2009/0057664 A1* | 3/2009 | Lim ........................ H01L 22/34 250/307 |
| 2014/0264632 A1 | 9/2014 | Richter et al. |
| 2016/0293717 A1 | 10/2016 | Kim et al. |
| 2017/0076973 A1* | 3/2017 | Lee ........................ H01L 29/24 |
| 2020/0185524 A1 | 6/2020 | Paak et al. |

\* cited by examiner

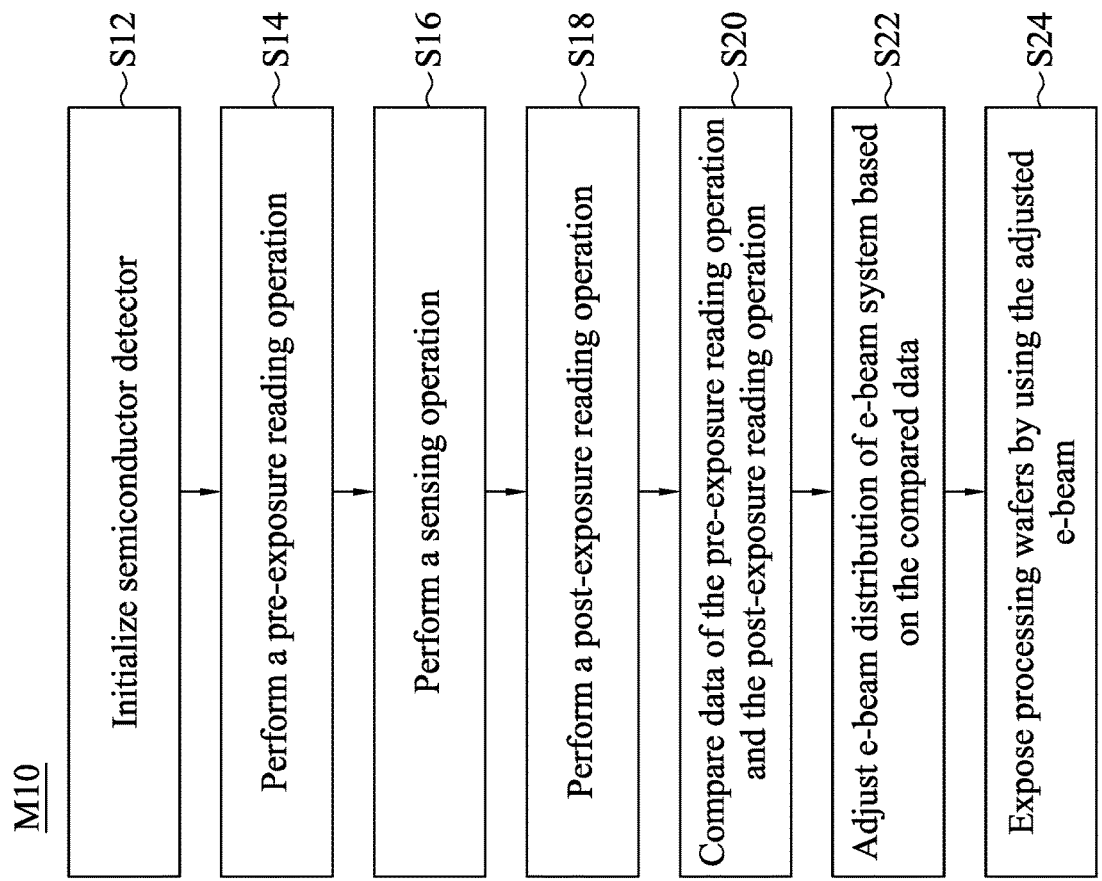

DETECTION USING SEMICONDUCTOR DETECTOR

PRIORITY CLAIM AND CROSS-REFERENCE

This application claims priority to U.S. Provisional Application Ser. No. 63/224,796, filed Jul. 22, 2021, which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the size has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a schematic diagram of an electron beam system for implementing one or more embodiments of the present disclosure.

FIG. 20 is a flowchart of a method for detecting light uniformity of e-beam according to aspects of the present disclosure in various embodiments.

DETAILED DESCRIPTION

Figure 1:
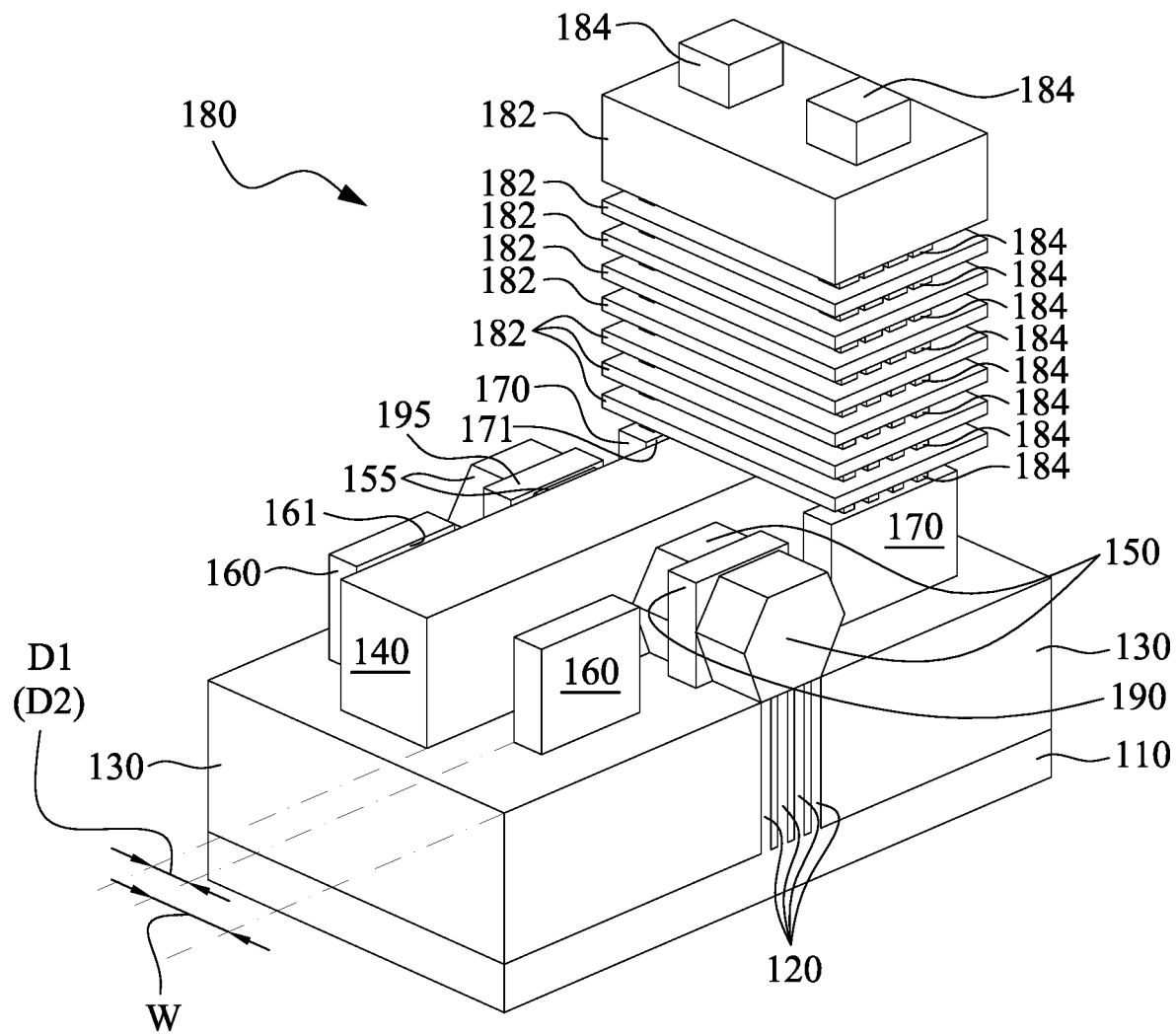
FIG. 1 is a perspective view of a semiconductor detector in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to semiconductor detectors, methods of forming the same, and methods of using the same. More particularly, some embodiments of the present disclosure are related to high-density and powerless semiconductor detectors for detecting e-beam lights. In some embodiments, the semiconductor detectors may be realized on the device including planar devices, multi-gate devices, FinFETs, nanosheet-gate FETs, and gate-all-around FETs.

Figure 2:
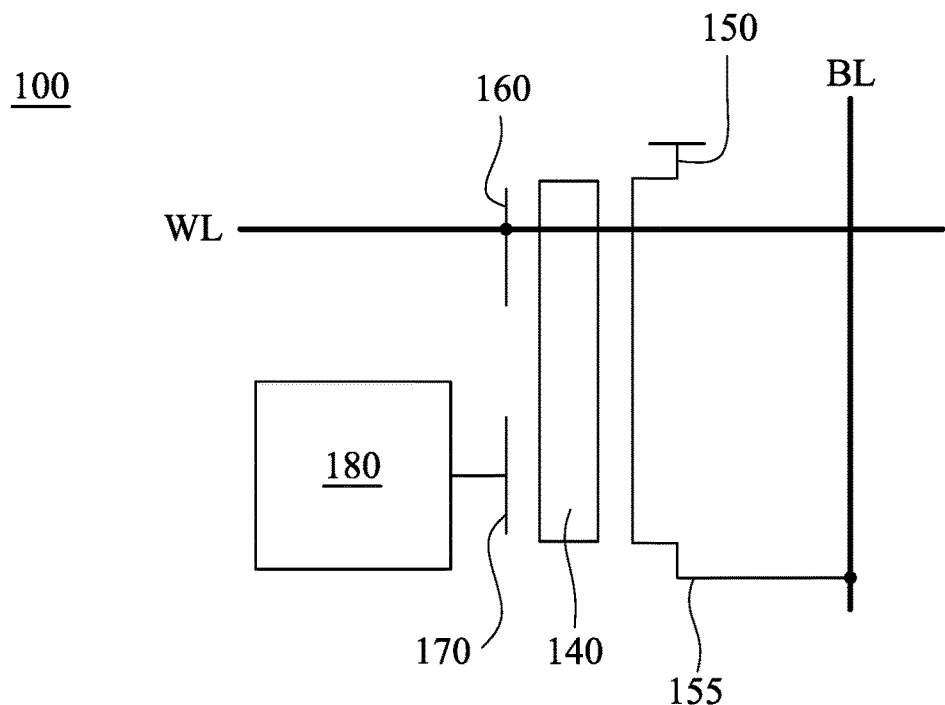
FIG. 2 is a schematic circuit diagram illustrating the semiconductor detector of FIG. 1 according to some embodiments of the present disclosure.

FIG. 1 is a perspective view of a semiconductor detector in accordance with some embodiments, and FIG. 2 is a schematic circuit diagram illustrating the semiconductor detector of FIG. 1 according to some embodiments of the present disclosure. The semiconductor detector in FIGS. 1 and 2 may include a single cell unit 100. The (cell unit 100 of the) semiconductor detector includes a substrate 110, at least one active region, an isolation structure 130, a gate structure 140, a first source/drain structure 150, a second source/drain structure 155, at least one reading contact 160, at least one sensing contact 170, and a sensing pad structure 180. The active region may be a semiconductor fin 120 protruding from the substrate 110. It is noted that although there are four semiconductor fins 120 in FIG. 1, the claimed scope of the present disclosure is not limited in this respect. In some other embodiments, a person having ordinary skill in the art can manufacture suitable number of the semiconductor fins 120 of the semiconductor detector according to actual situations.

The isolation structure 130 is over the substrate 110 and laterally surrounds the semiconductor fins 120. That is, bottom portions of the semiconductor fins 120 are embedded in the isolation structure 130. The isolation structure 130 may be shallow trench isolation (STI) regions.

The gate structure 140 is over the isolation structure 130 and crosses the semiconductor fins 120. Portions of the semiconductor fins 120 covered by the gate structure 140 are referred to as channel portions of the semiconductor fins 120. In some embodiments, there is no electrically conductive element physically connected to the gate structure 140, such that the gate structure 140 can be referred to as a floating gate.

The first source/drain structure 150 and the second source/drain structure 155 are over the semiconductor fins 120 and are on opposite sides of the gate structure 140. As such, one of the first source/drain structure 150 and the second source/drain structure 155 serves as a source terminal and another one of the first source/drain structure 150 and the second source/drain structure 155 serves as a drain terminal. Portions of the semiconductor fins 120 under the first source/drain structure 150 and portions of the semiconductor fins 120 under the second source/drain structure 155 are referred to as source/drain portions of the semiconductor fins 120.

Two reading contacts 160 are adjacent to the gate structure 140 and directly on the isolation structure 130, such that the two reading contacts 160 are spaced apart from the semiconductor fins 120. The reading contacts 160 are on opposite sides of the gate structure 140 and are further spaced apart from the first source/drain structure 150 and the second source/drain structure 155. The reading contacts 160 are separated from the gate structure 140 by a dielectric material (e.g., the gate spacers 550, the CESL 560, and/or the ILD layer 565 in FIG. 15A). As such, the gate structure 140, the reading contact 160, and the dielectric material therebetween form a capacitance. A distance D1 is formed between the reading contact 160 and the gate structure 140, and each of the reading contacts 160 has an inner surface 161 facing the gate structure 140. A coupling ratio between the gate structure 140 and the reading contact 160 is determined at least by the distance D1 and an area of the inner surface 161 of the reading contact 160. In some embodiments, the coupling ratio between the gate structure 140 and the reading contact 160 is in a range of about 10% to about 50%. Further, the distance D1 may be smaller than a width W of the first source/drain structure 150. In some embodiments, (the cell unit 100 of) the semiconductor detector includes a single reading contact 160 on one side of the gate structure 140.

Two sensing contacts 170 are adjacent to the gate structure 140 and directly on the isolation structure 130, such that the two sensing contacts 170 are spaced apart from the semiconductor fins 120. The sensing contacts 170 are on opposite sides of the gate structure 140 and are further spaced apart from the first source/drain structure 150 and the second source/drain structure 155. In some embodiments, the sensing contact 170 and the reading contact 160 are on opposite sides of the first source/drain structure 150 (or the second source/drain structure 155), such that the first source/drain structure 150 is between the sensing contact 170 and the reading contact 160. The sensing contacts 170 are separated from the gate structure 140 by a dielectric material (e.g., the gate spacers 550, the CESL 560, and/or the ILD layer 565 in FIG. 15A). As such, the gate structure 140, the sensing contact 170, and the dielectric material therebetween form a capacitance. A distance D2 is formed between the sensing contact 170 and the gate structure 140, and each of the sensing contact 170 has an inner surface 171 facing the gate structure 140. A coupling ratio between the gate structure 140 and the sensing contact 170 is determined at least by the distance D2 and an area of the inner surface 171 of the sensing contact 170. In some embodiments, the coupling ratio between the gate structure 140 and the sensing contact 170 is in a range of about 10% to about 50%. Further, the distance D2 may be smaller than the width W of the first source/drain structure 150. In some embodiments, (the cell unit 100 of) the semiconductor detector includes a single sensing contact 170 on one side of the gate structure 140. Moreover, the isolation structure 130 is in contact with the reading contacts 160, the sensing contacts 170, and the semiconductor fins 120.

The sensing pad structure 180 is electrically connected to the sensing contacts 170. In some embodiments, the sensing pad structure 180 is disposed over the sensing contacts 170 and the gate structure 140. In some embodiments, the sensing pad structure 180 includes a plurality of sensing pads 182 and sensing vias 184 between adjacent sensing pads 182. Some of the sensing vias 184 interconnect adjacent sensing pads 182, and some of the sensing vias 184 interconnect the bottommost sensing pad 182 and the sensing contacts 170. The sensing pads 182 and the sensing vias 184 are conductive materials, such that electrons can flow from the sensing pads 182 to the sensing contacts 170. Further, a capacitance can be formed between the bottommost sensing pad 182 and the gate structure 140 if the bottommost sensing pad 182 is close enough to the gate structure 140.

In some embodiments, the sensing pad structure 180 includes a single sensing pad 182, which is connected to the sensing contacts 170 through the sensing vias 184. The single sensing pad 182 may be at the lowest level (e.g., M0 level) of the sensing pad structure 180. In some other embodiments, the single sensing pad 182 may at the middle level (e.g., M1, M2, . . . level) or the topmost level (e.g., Mn level) of the sensing pad structure 180 according to various requirements.

The (cell unit 100 of the) semiconductor detector further includes a word line WL and a bit line BL. The word line WL is electrically connected to the reading contact 160, and the bit line BL is electrically connected to the second source/drain structure 155 (i.e., the drain of the cell unit 100). For example, the bit line BL is connected to the second source/drain structure 155 through a source/drain contact 195. Further, the word line WL is electrically isolated from the gate structure 140. In some embodiments, the first source/drain structure 150 is electrically connected to a ground (line) GND, which provides a reference electrical potential (e.g., about OV) to the semiconductor detector during programming, erasing, and/or reading processes, through a source/drain contact 190.

Figure 3:
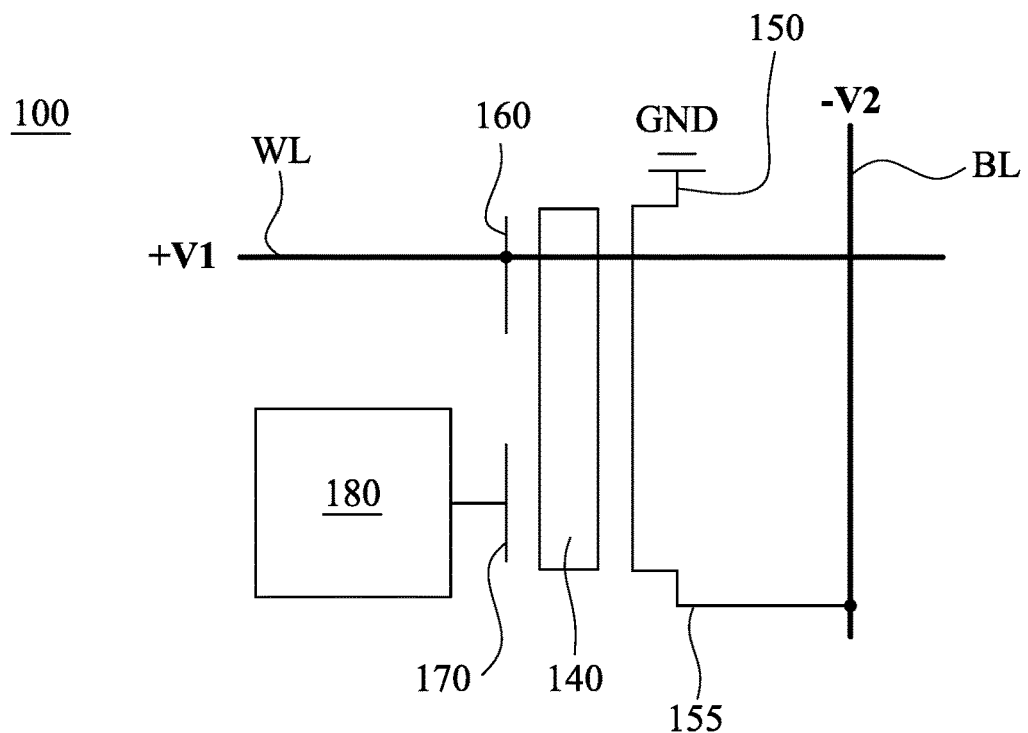
FIG. 3 is a schematic circuit diagram illustrating the semiconductor detector of FIG. 2 at a programming operation according to some embodiments of the present disclosure.

The (cell unit 100 of the) semiconductor detector has four different states it can be in: programming, erasing, sensing, and reading. The semiconductor detector performs the four different states (program, erase, sense, and read) as follows:

Programming—FIG. 3 is a schematic circuit diagram illustrating the semiconductor detector of FIG. 2 at a programming operation according to some embodiments of the present disclosure. The start of a program cycle of the semiconductor detector begins by applying a positive voltage +V1 (e.g., about 8 V to about 10 V) to the word line WL and applying a negative voltage −V2 (e.g., about 0.6 V to about 0.7 V) to the bit line BL. Further, the first source/drain structure 150 is connected to the ground GND. As such, the gate structure 140 is floating and an electric field is formed in the gate structure 140, driving electrons to flow from the substrate 110 to the gate structure 140 through tunneling effect, and the electrons can be stored in the gate structure 140.

Figure 4:
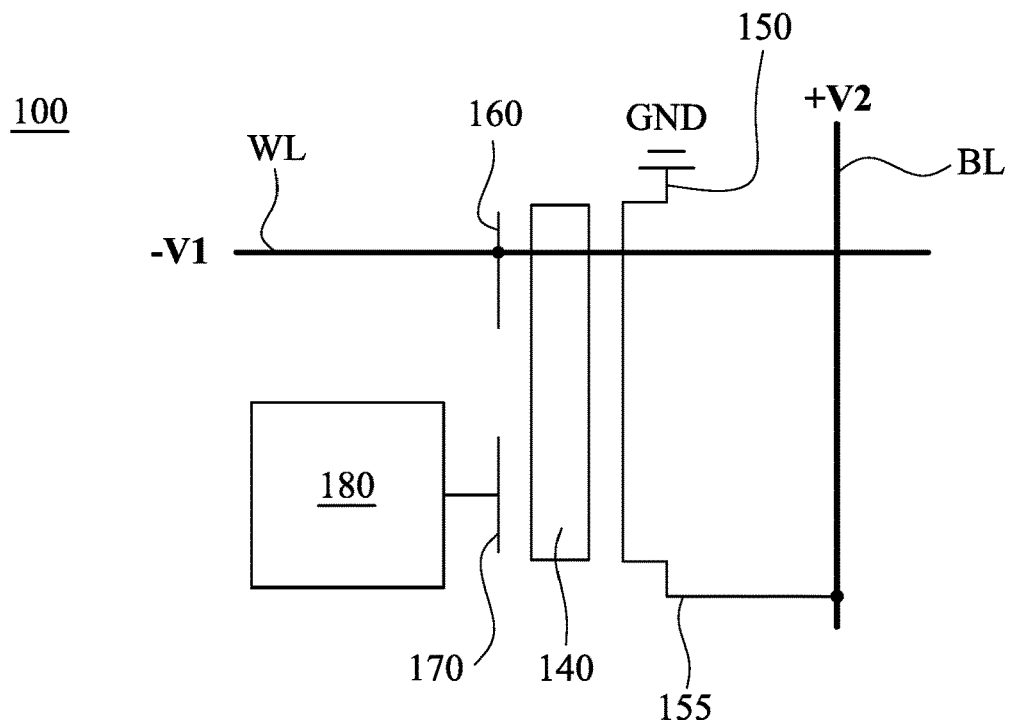
FIG. 4 is a schematic circuit diagram illustrating the semiconductor detector of FIG. 2 at an erasing operation according to some embodiments of the present disclosure.

Erasing—FIG. 4 is a schematic circuit diagram illustrating the semiconductor detector of FIG. 2 at an erasing operation according to some embodiments of the present disclosure. The start of an erase cycle of the semiconductor detector begins by applying a negative voltage −V1 (e.g., about 8 V to about 10 V) to the word line WL and applying a positive voltage +V2 (e.g., about 0.6 V to about 0.7 V) to the bit line BL. Further, the first source/drain structure 150 is connected to the ground GND. As such, the gate structure 140 is floating and an electric field is formed in the gate structure 140, driving electrons to flow from the gate structure 140 to the substrate 110 through tunneling effect, and the gate structure 140 is supposed to be free of electrons.

Sensing—During the sense cycle of the semiconductor detector, no power is applied to the word line WL, the bit line BL, and the first source/drain structure 150 as shown in FIG. 2. In other word, the semiconductor detector is powerless in the sensing mode. When e-beam light is incident on the sensing pad structure 180, electrons of the e-beam light enter the sensing pad structure 180 and flow to the sensing contact(s) 170. An electrical coupling is formed between the sensing contact(s) 170 and the gate structure 140, and the voltage in the gate structure 140 is changed.

Figure 5:
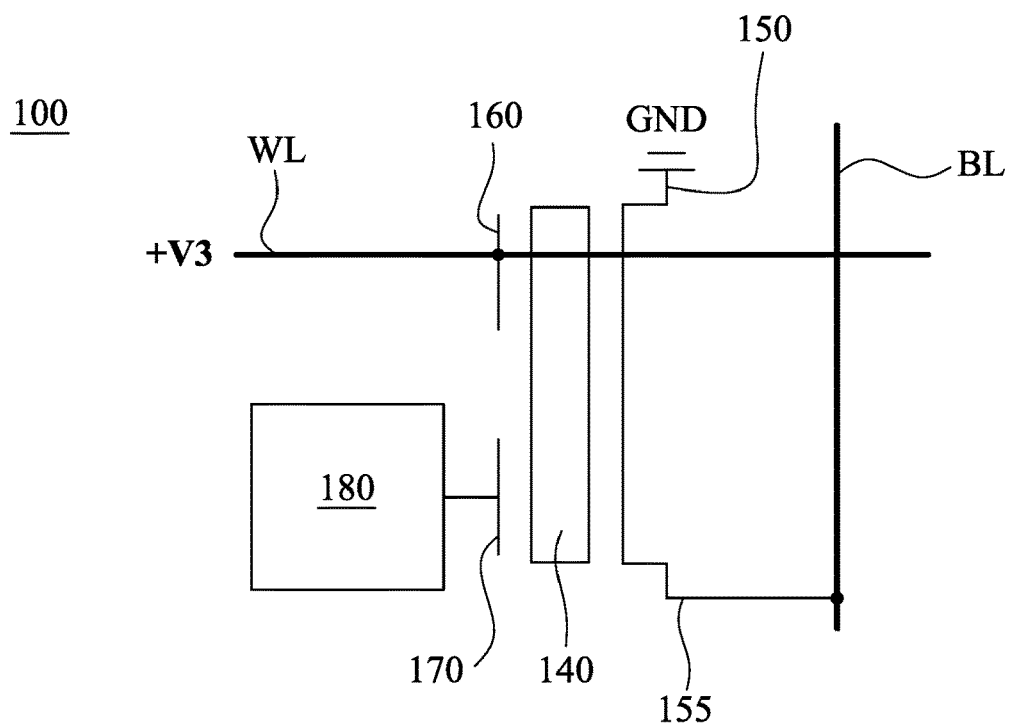
FIG. 5 is a schematic circuit diagram illustrating the semiconductor detector of FIG. 2 at a reading operation according to some embodiments of the present disclosure.

Reading—FIG. 5 is a schematic circuit diagram illustrating the semiconductor detector of FIG. 2 at a reading operation according to some embodiments of the present disclosure. The start of a read cycle of the semiconductor detector begins by applying a varied positive voltage +V3 (e.g., from about 0 V to about 6 V) to the word line WL, applying ground GND to the first source/drain structure 150, and the gate structure 140 is floating, such that a corresponding current under the varied positive voltage +V3 is read from the bit line BL. From the results of experiments, this configuration is read disturb free with the positive voltage +V3.

Figure 6:
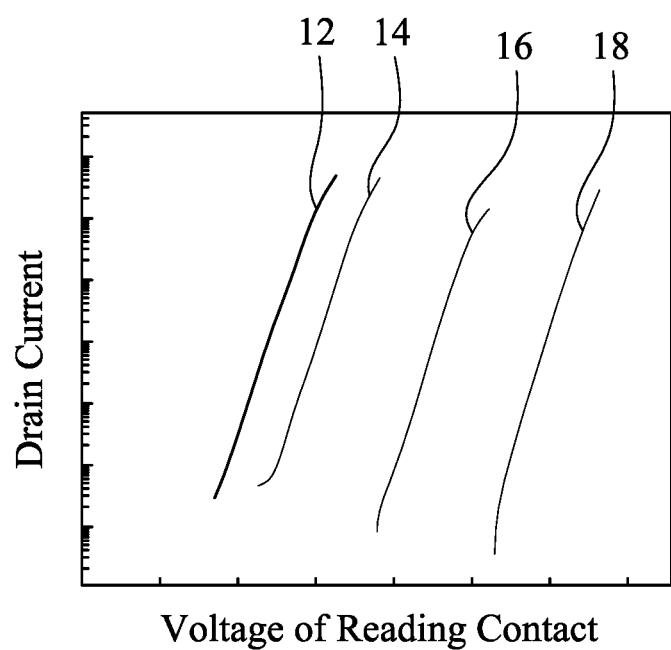
FIG. 6 is a plot of I-V characteristics of a bit line in an exemplary detector cell unit before and after the sensing operation for E-beam light.

FIG. 6 is a plot of I-V characteristics of a bit line in an exemplary detector cell unit 100 before and after the sensing operation for E-beam light. Before the sensing operation, the gate structure 140 is substantially free of electrons, and the line 12 in FIG. 6 shows the I-V curve of the cell unit 100 before the sensing operation. The lines 14, 16, and 18 show I-V curves of the cell unit 100 after the sensing operation under first, second, and third intensities of E-beam light, respectively. The third intensity is higher than the second intensity, which is higher than the first intensity.

Figure 7:
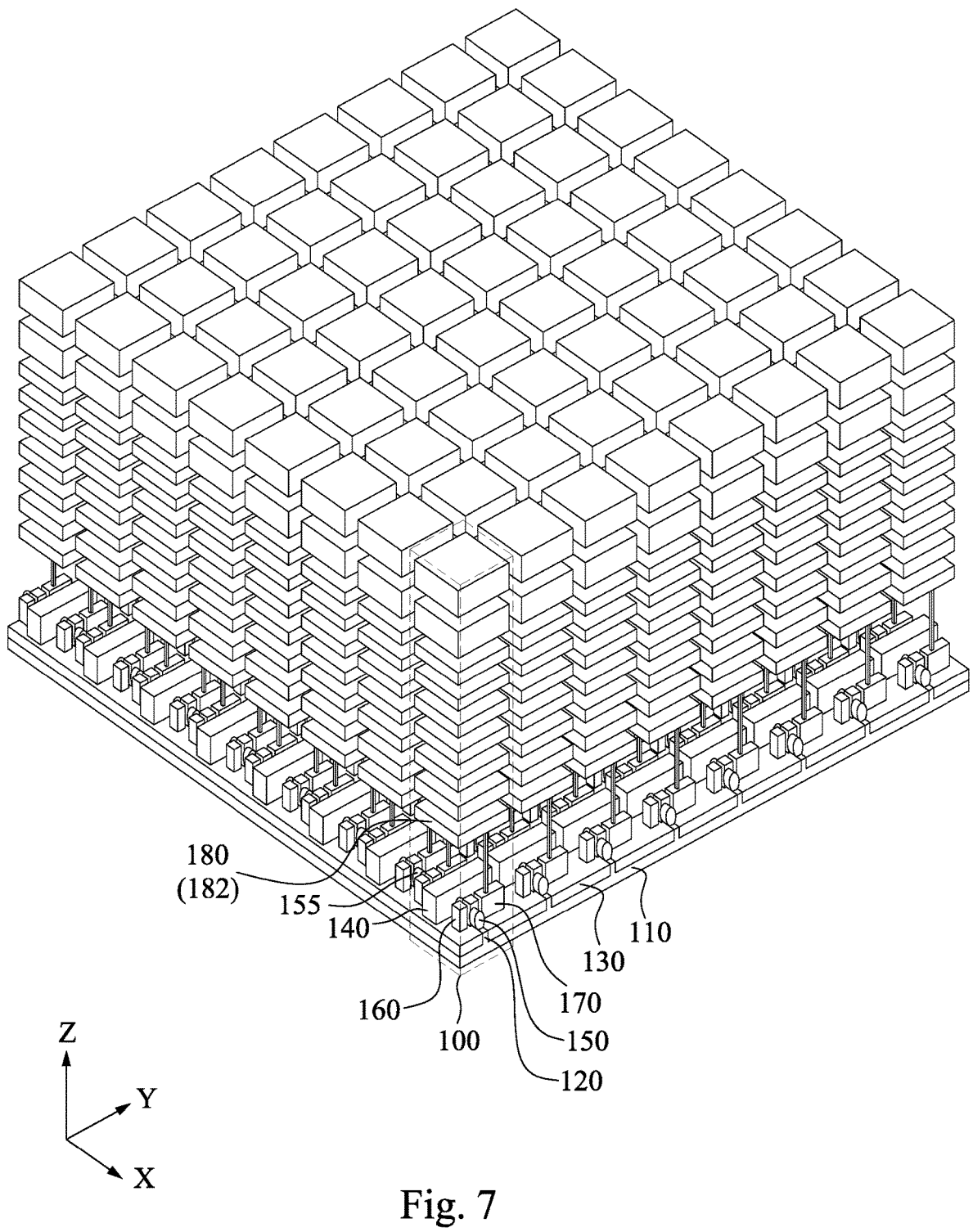
FIG. 7 is a perspective view of a semiconductor detector in accordance with some embodiments.
Figure 8:
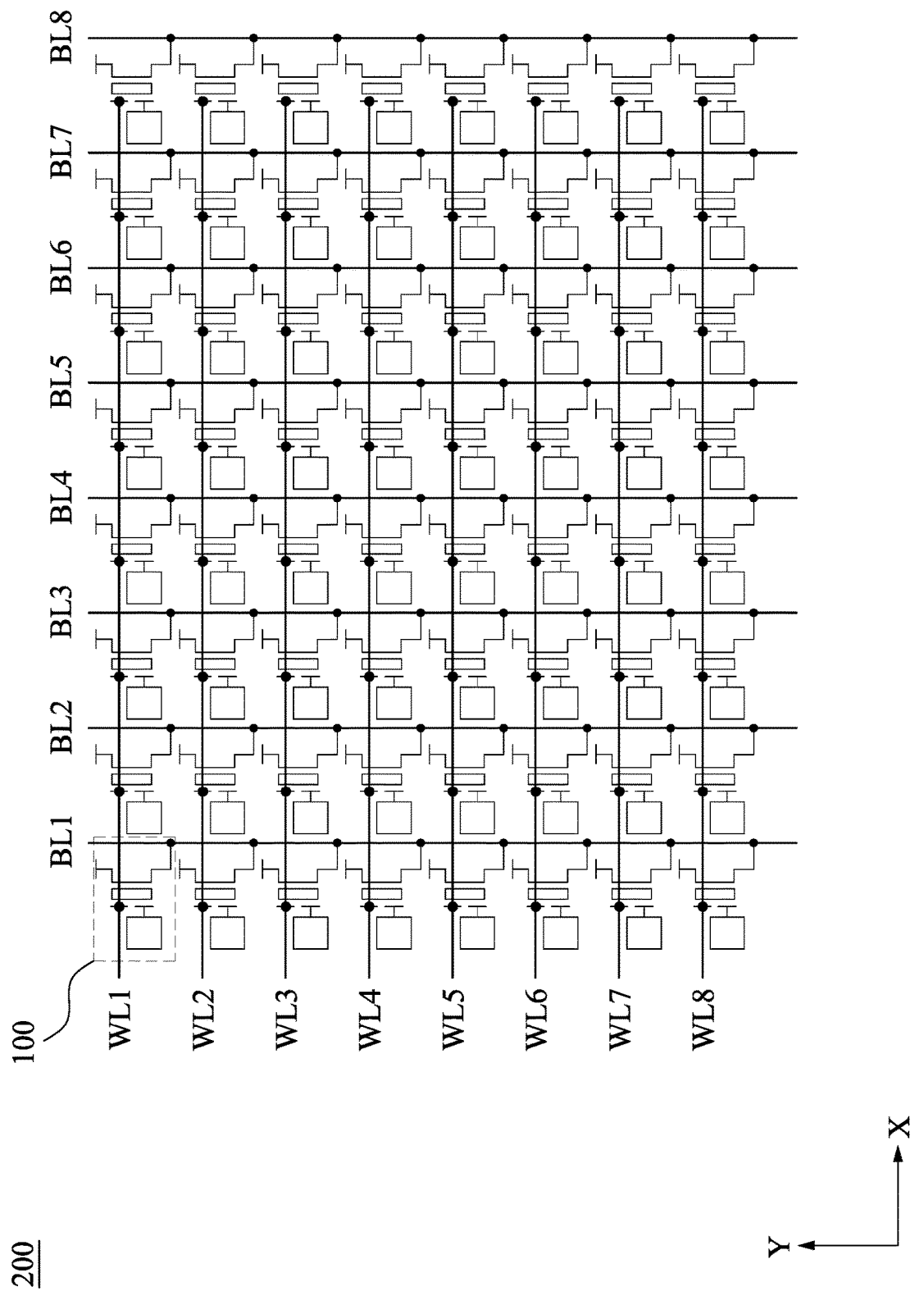
FIG. 8 is a schematic circuit diagram illustrating the semiconductor detector of FIG. 7 according to some embodiments of the present disclosure.

FIG. 7 is a perspective view of a semiconductor detector 200 in accordance with some embodiments, and FIG. 8 is a schematic circuit diagram illustrating the semiconductor detector 200 of FIG. 7 according to some embodiments of the present disclosure. In some embodiments, the semiconductor detector 200 includes a plurality of cell units 100. In greater detail, the cell unit 100 in FIG. 1 can be arranged as an array. That is, a plurality of the cell units 100 can be arranged in an X-direction and/or a Y-direction. The semiconductor detector 200 further includes a plurality of word lines (e.g., word lines WL1, WL2, WL3, WL4, WL5, WL6, WL7, and WL8). Each of the word lines interconnects reading contacts 160 of the cell units 100 of the same row (i.e., arranged in the X-direction). The semiconductor detector 200 further includes a plurality of bit lines (e.g., bit lines BL1, BL2, BL3, BL4, BL5, BL6, BL7, and BL8). Each of the bit lines interconnects the second source/drain structures 155 of the cell units 100 of the same column (i.e., arranged in the Y-direction). For clarity, the word lines and the bit lines are shown in FIG. 8 and are omitted in FIG. 7. With such configuration, the semiconductor detector 200 can collect the electron distribution of the e-beam light in the XY-directions simultaneously. In some other embodiments, the sensing pad structure 180 of each of the cell units 100 in FIG. 7 includes a single sensing pad 182 (which may be at an arbitrary height of the corresponding sensing pad structure 180). Other relevant structural details of the cell units 100 of the semiconductor detector 200 are substantially the same as or similar to the cell unit 100 of the semiconductor detector in FIG. 1, and, therefore, a description in this regard will not be repeated hereinafter.

Figure 9:
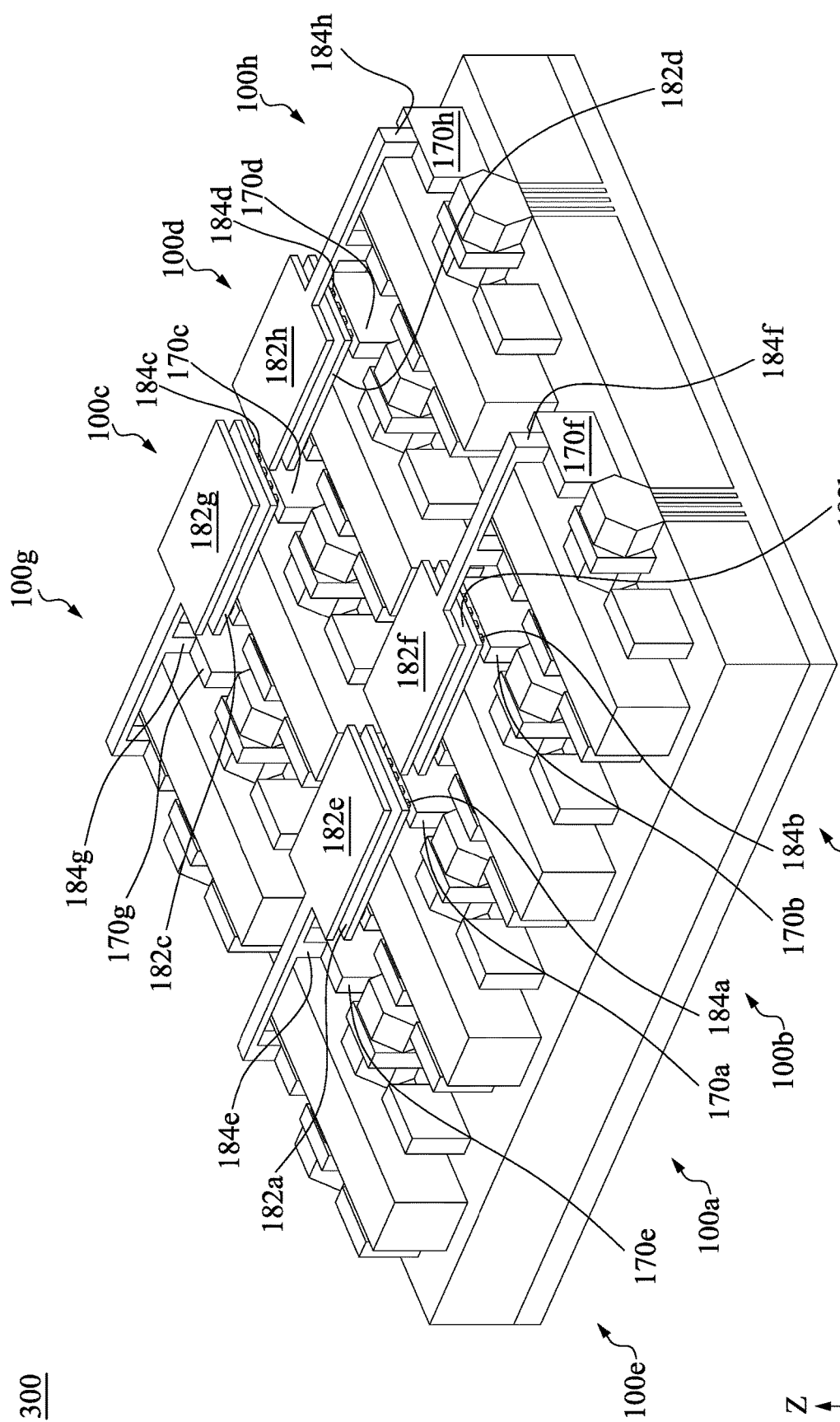
FIG. 9 is a perspective view of a semiconductor detector in accordance with some embodiments.

FIG. 9 is a perspective view of a semiconductor detector 300 in accordance with some embodiments. The semiconductor detector 300 includes a plurality of cell units 100a, 100b, 100c, 100d, 100e, 100f, 100g, and 100h. Each of the cell units 100a-100h has a similar configuration to the cell unit 100 in FIG. 1 except the sensing pad structures. In FIG. 9, each of the cell units 100a-100h has a sensing pad structure including single sensing pad. In greater detail, the cell unit 100a includes a sensing pad 182a connected to sensing contacts 170a through sensing vias 184a; the cell unit 100b includes a sensing pad 182b connected to sensing contacts 170b through sensing vias 184b; the cell unit 100c includes a sensing pad 182c connected to sensing contacts 170c through sensing vias 184c; the cell unit 100d includes a sensing pad 182d connected to sensing contacts 170d through sensing vias 184d. The cell units 100a, 100b, 100c, and 100d are arranged as a two-dimensional array, such that the cell units 100a, 100b, 100c, and 100d can collect the electron distribution of the e-beam light in the XY-directions simultaneously.

Further, the cell unit 100e includes a sensing pad 182e connected to sensing contacts 170e through sensing vias 184e; the cell unit 100f includes a sensing pad 182f connected to sensing contacts 170f through sensing vias 184f; the cell unit 100g includes a sensing pad 182g connected to sensing contacts 170g through sensing vias 184g; the cell unit 100*h* includes a sensing pad 182*h* connected to sensing contacts 170*h* through sensing vias 184*h*. The sensing pad 182*e* is directly above and covers the sensing pad 182*a*, but there is no conductive via between the sensing pad 182*e* and the sensing pad 182*a*. That is, the sensing pad 182*e* is electrically isolated from the sensing pad 182*a*. The sensing pad 182*f* is directly above and covers the sensing pad 182*b*, but there is no conductive via between the sensing pad 182*f* and the sensing pad 182*b*. That is, the sensing pad 182*f* is electrically isolated from the sensing pad 182*b*. The sensing pad 182*g* is directly above and covers the sensing pad 182*c*, but there is no conductive via between the sensing pad 182*g* and the sensing pad 182*c*. That is, the sensing pad 182*g* is electrically isolated from the sensing pad 182*c*. The sensing pad 182*h* is directly above and covers the sensing pad 182*d*, but there is no conductive via between the sensing pad 182*h* and the sensing pad 182*d*. That is, the sensing pad 182*h* is electrically isolated from the sensing pad 182*d*. With such configuration, the semiconductor detector 300 can collect the electron distribution of the e-beam light in the XYZ-directions simultaneously. In some embodiments, the semiconductor detector 300 includes more cell units for detecting different X, Y, and/or Z positions. Other relevant structural details of the cell units 100*a*-100*h* of the semiconductor detector 300 are substantially the same as or similar to the cell unit 100 of the semiconductor detector in FIG. 1, and, therefore, a description in this regard will not be repeated hereinafter.

Figure 15A:
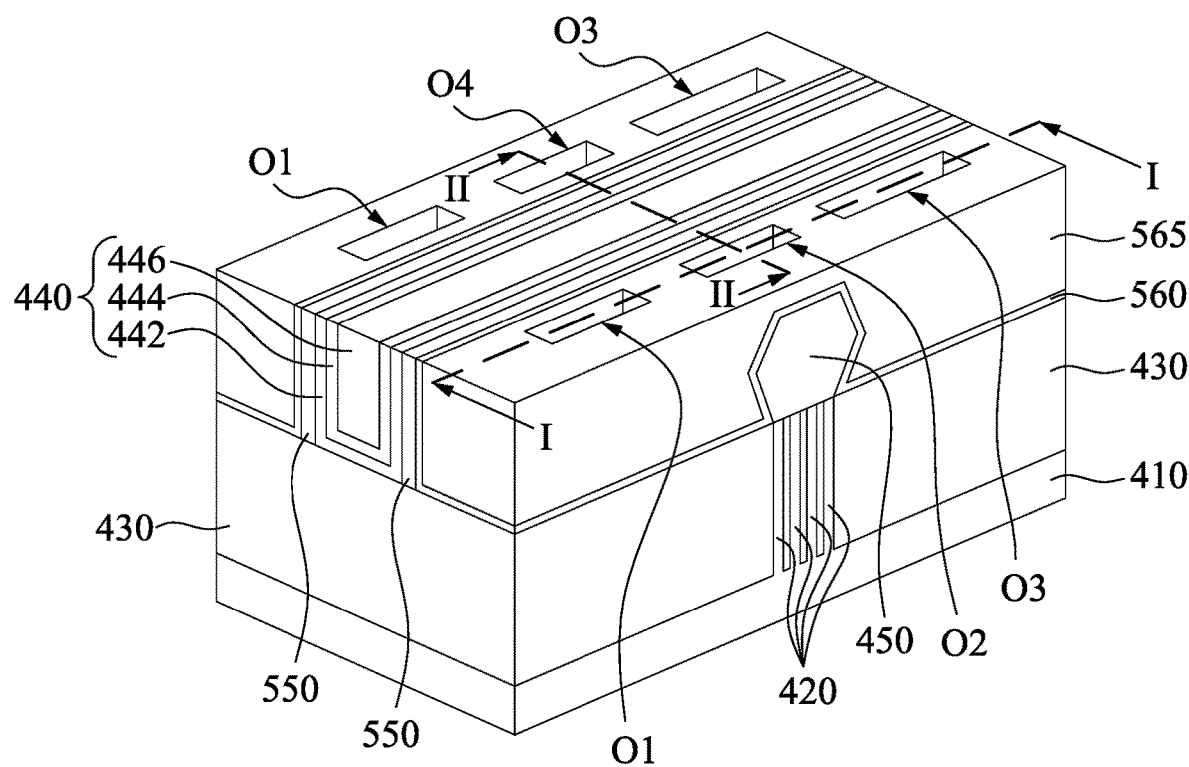
Figure 15A:
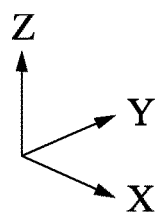
Figure 15B:
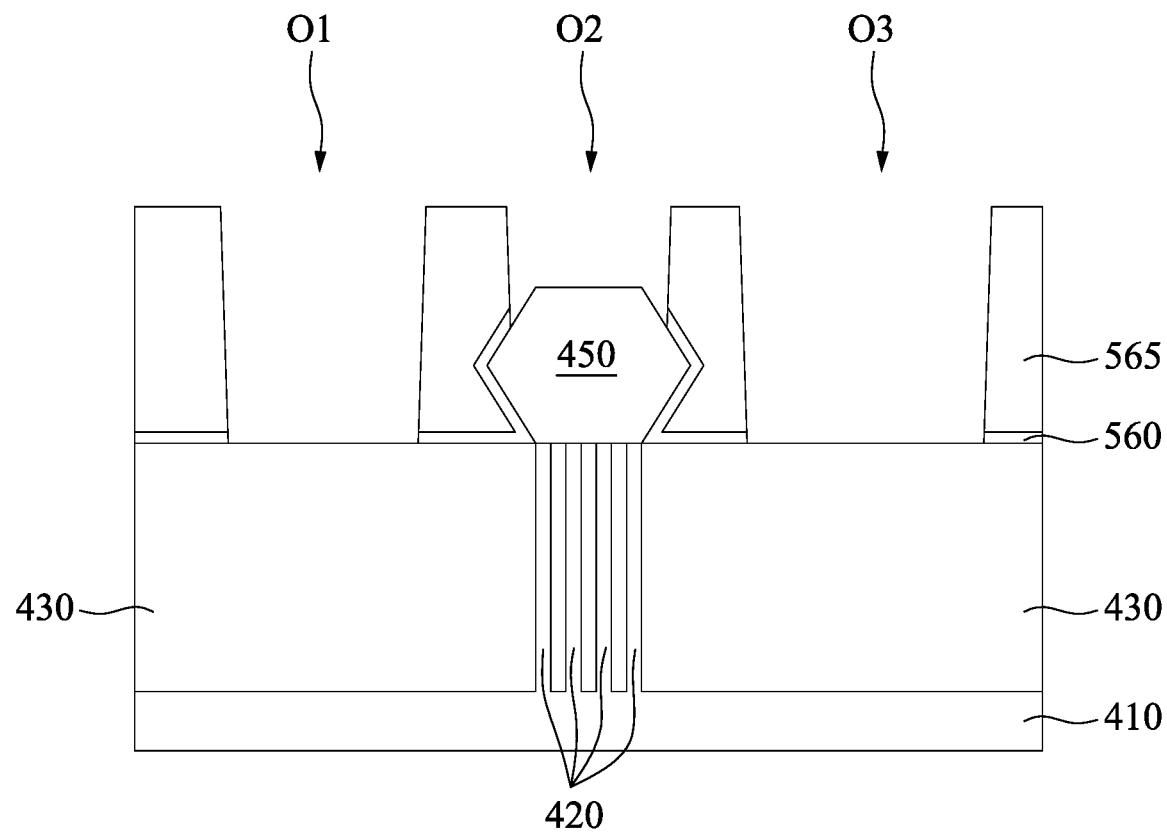
Figure 15C:
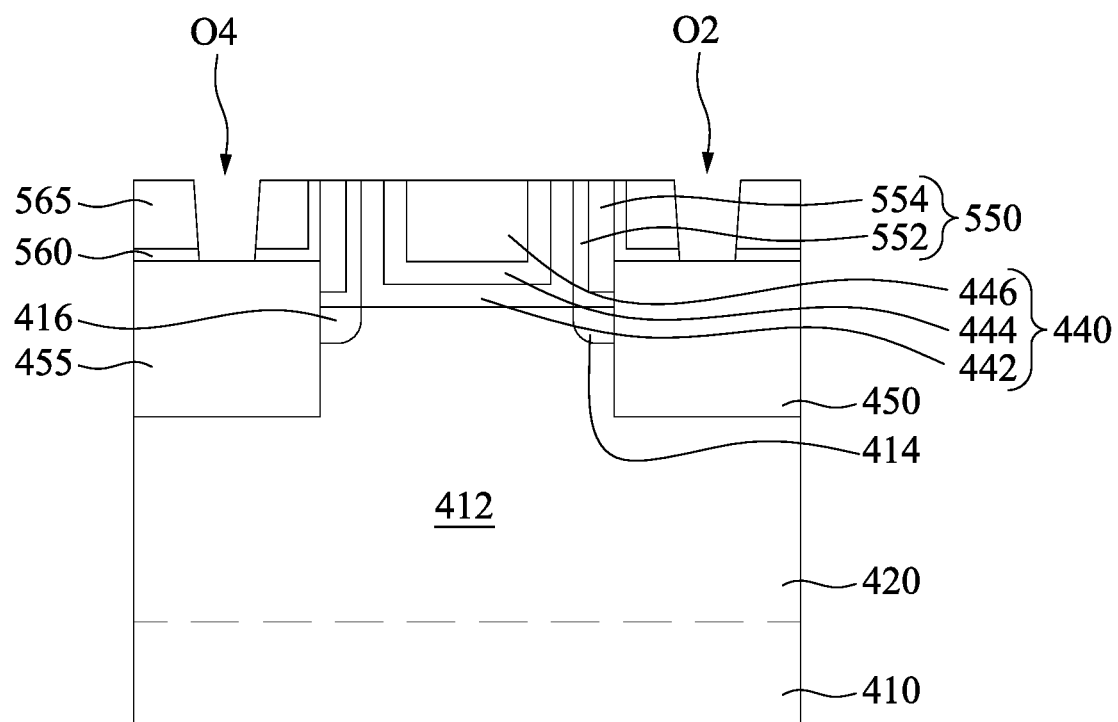
Figure 16A:
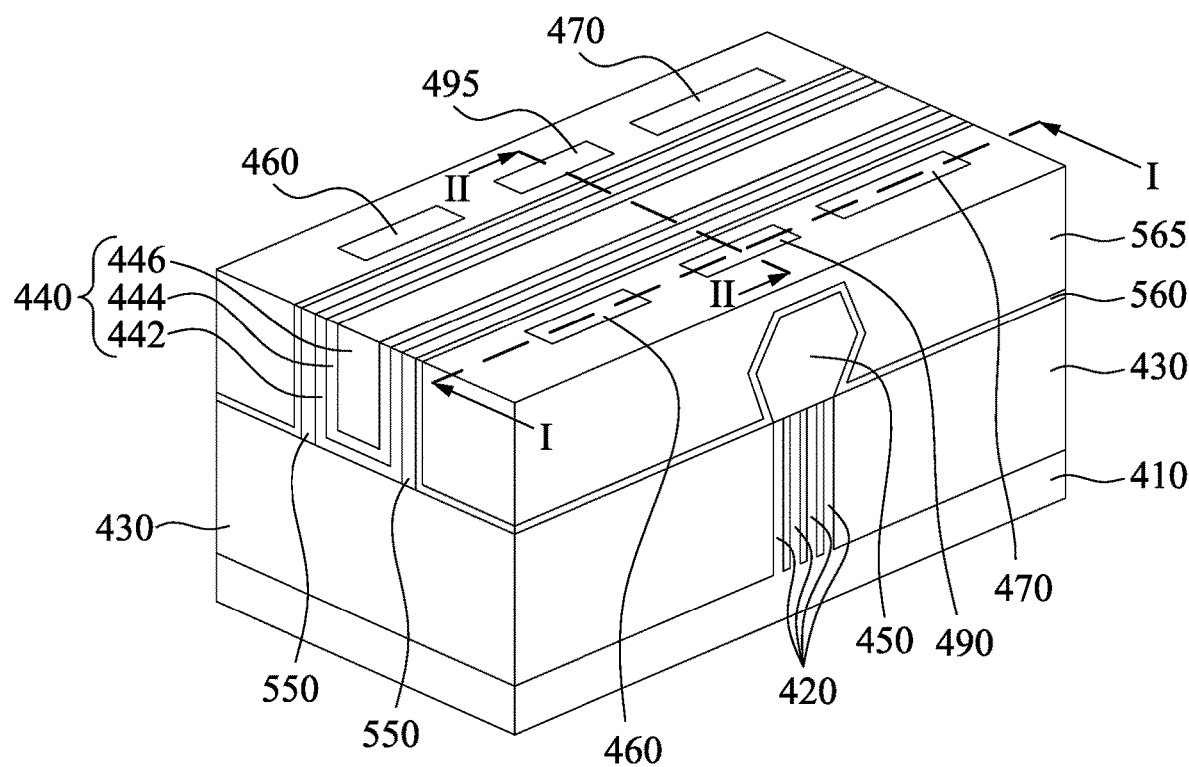
Figure 16B:
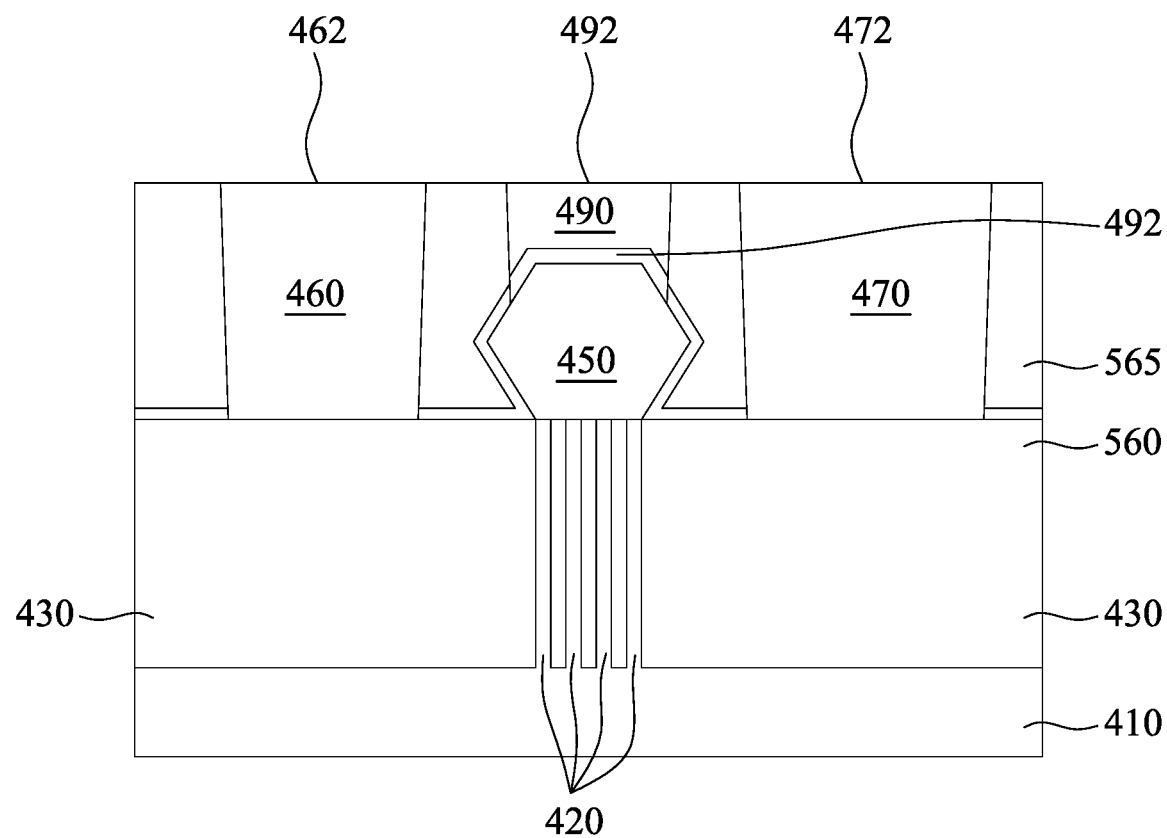
Figure 16C:
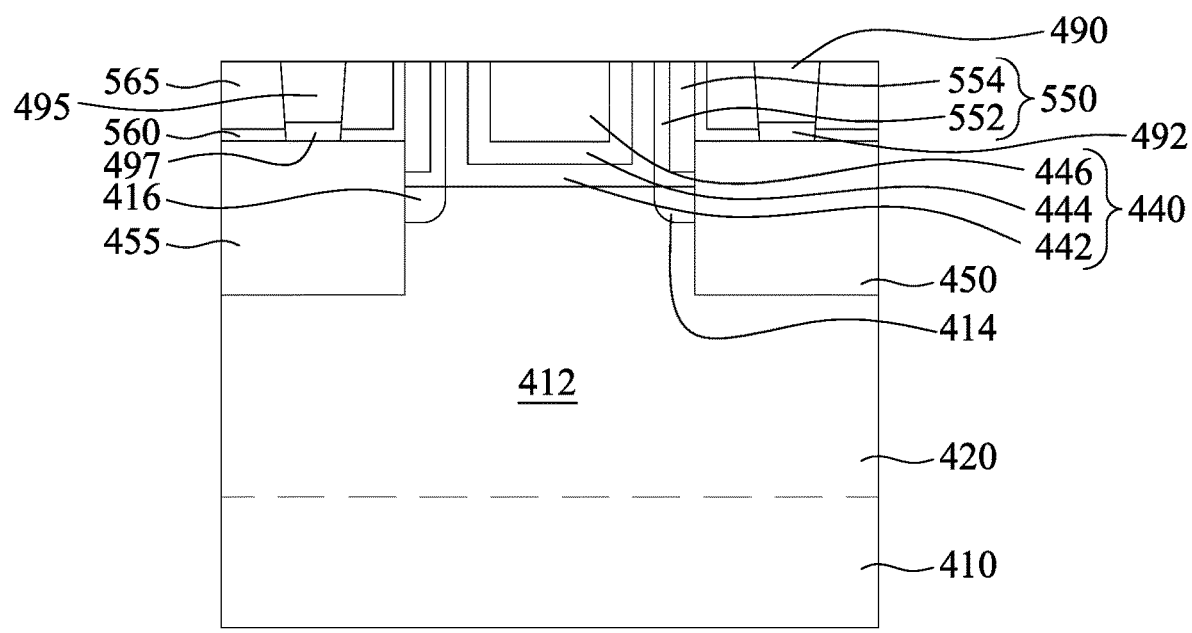
Figure 17A:
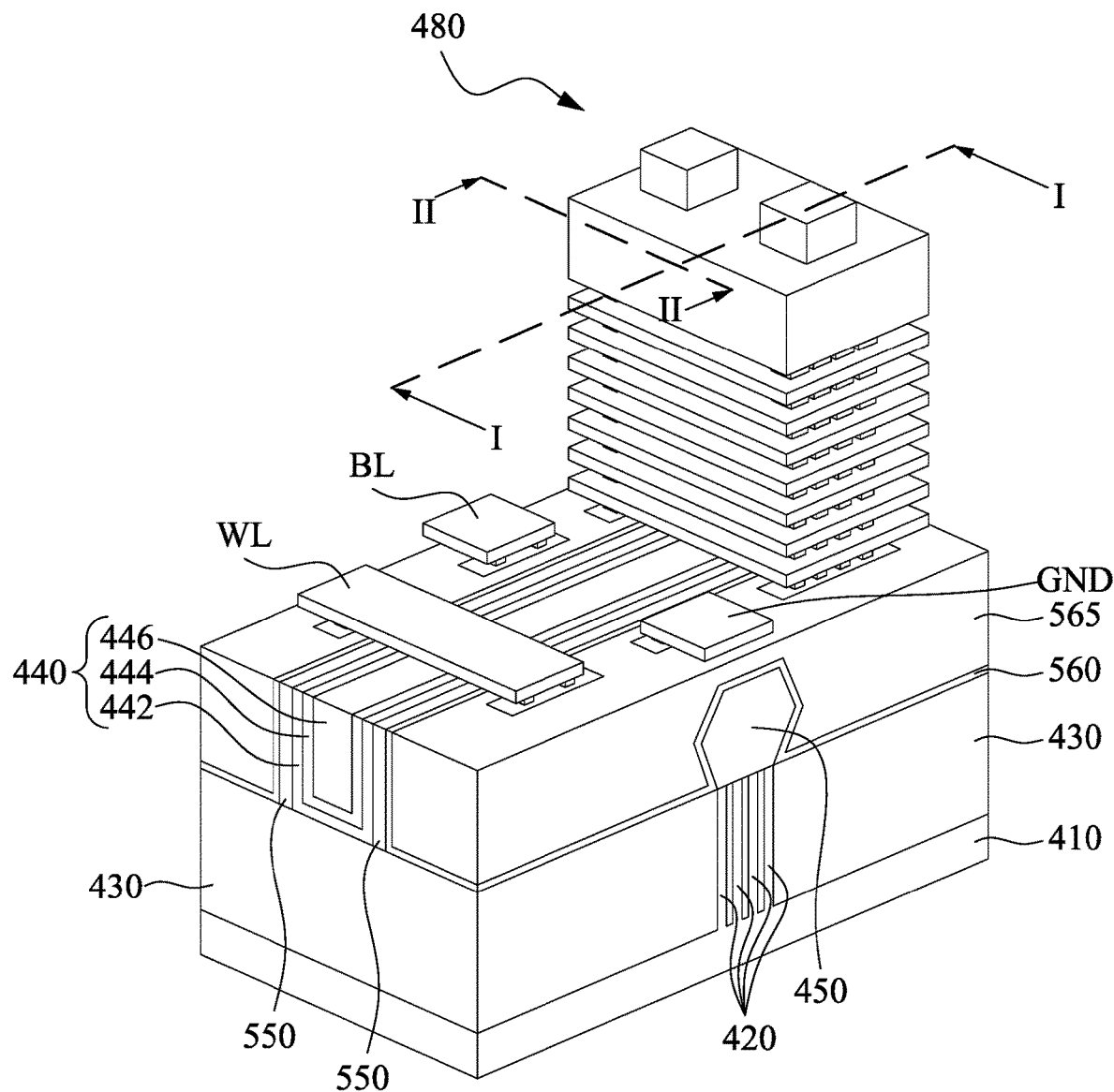
Figure 17B:
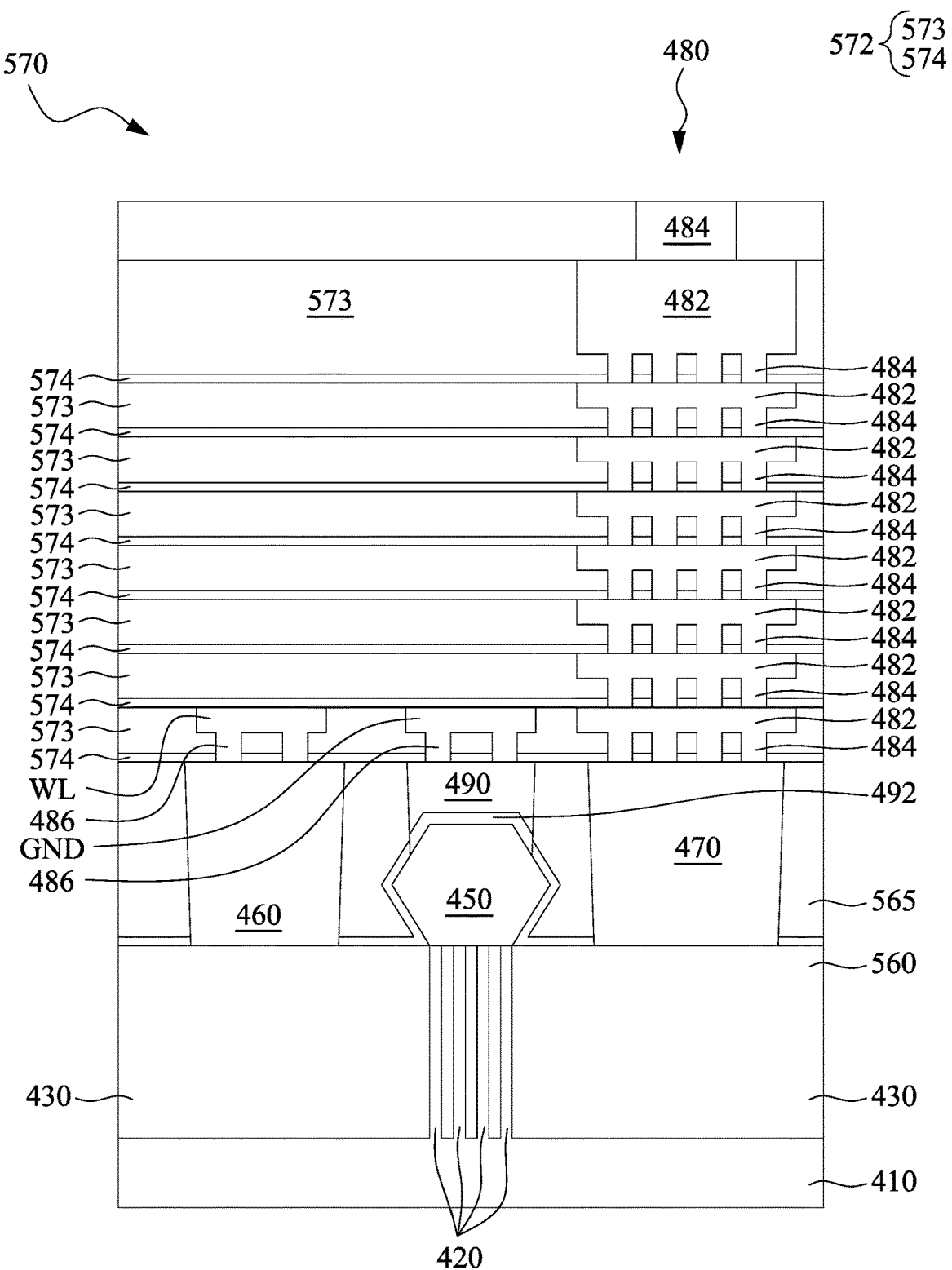
Figure 17C:
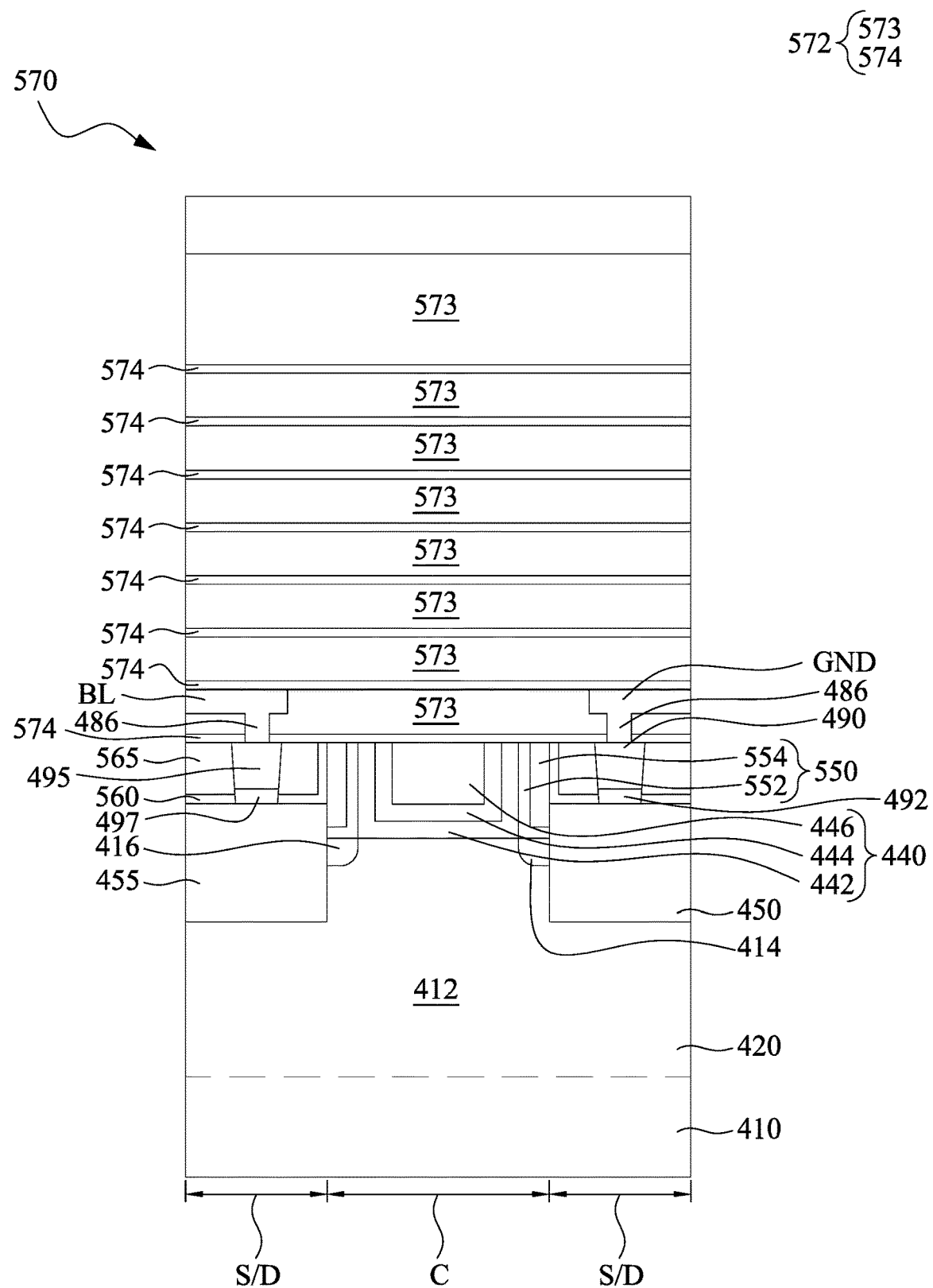

FIGS. 10-17C illustrate a method for manufacturing a semiconductor detector at various stages in accordance with some embodiments of the present disclosure. In addition to the semiconductor detector, FIGS. 10-15A, 16A, and 17A depict X-axis, Y-axis, and Z-axis directions. FIGS. 10-15A, 16A, and 17A are perspective views of some embodiments of the semiconductor detector at intermediate stages during fabrication. FIGS. 15B, 16B, and 17B are cross-sectional views of some embodiments of the semiconductor detector at intermediate stages during fabrication along a first cut (e.g., cut I-I), which is along a lengthwise direction of the reading contact 460 (or the sensing contact 470). FIGS. 15C, 16C, and 17C are cross-sectional views of some embodiments of the semiconductor detector at intermediate stages during fabrication along a second cut (e.g., cut II-II), which is along a lengthwise direction of a channel (i.e., the semiconductor fin 420).

Figure 10:
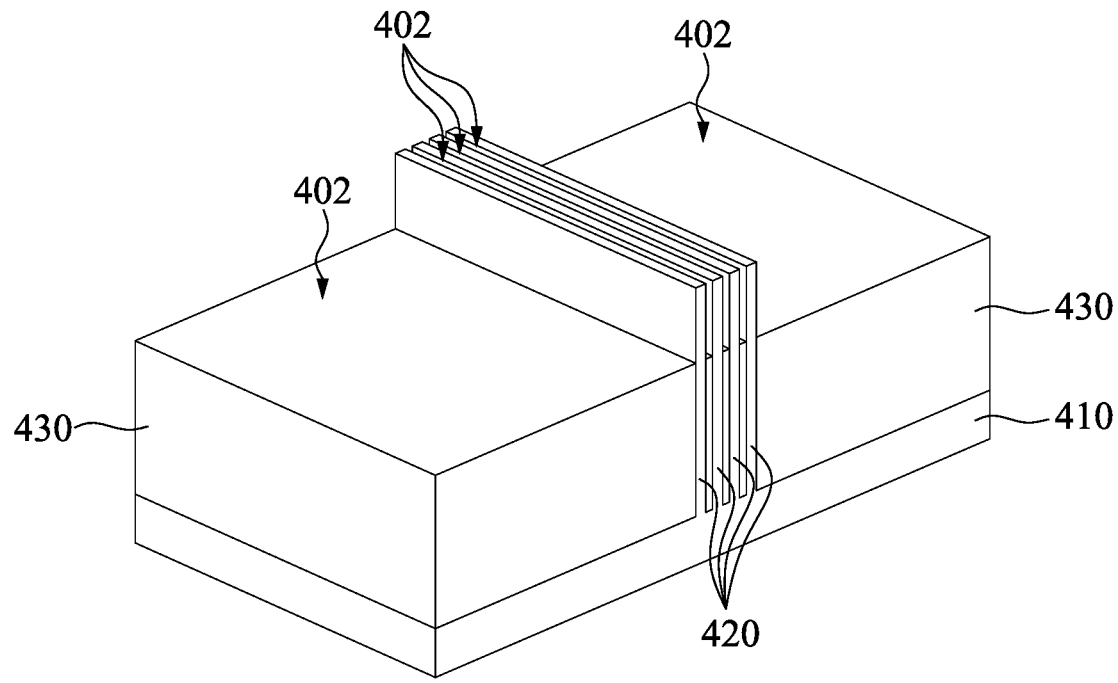
FIGS. 10-17C illustrate a method for manufacturing a semiconductor detector at various stages in accordance with some embodiments of the present disclosure.
Figure 10:
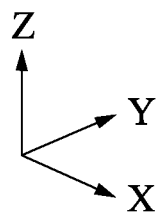

Reference is made to FIG. 10. A substrate 410 is provided. In some embodiments, the substrate 410 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 410 may include an epitaxial layer (epi-layer), which may be strained for performance enhancement, and/or may include a silicon-on-insulator (SOI) structure.

One or more semiconductor fins 420 are formed on the substrate 410. The semiconductor fins 420 may be P-type. That is, each of the semiconductor fins 420 may include a P-well region 412 (see FIG. 15C). The semiconductor fins 420 may be formed using, for example, a patterning process to form trenches such that trenches are formed between adjacent semiconductor fins 420. As discussed in greater detail below, the semiconductor fins 420 will be used to form FinFETs. It is understood that four semiconductor fins 420 are illustrated for purposes of illustration, but other embodiments may include any number of semiconductor fins. In some embodiments, one or more dummy semiconductor fins are formed adjacent to the semiconductor fins 420.

The semiconductor fins 420 may be formed by performing an etching process to the substrate 410. Specifically, a patterned hard mask structure is formed over the substrate 410. In some embodiments, the patterned hard mask structure is formed of silicon nitride, silicon oxynitride, silicon carbide, silicon carbon-nitride, or the like. For example, the patterned hard mask structure includes an oxide pad layer and a nitride mask layer over the oxide pad layer. The patterned hard mask structure covers a portion of the substrate 410 while leaves another portion of the substrate 410 uncovered. The substrate 410 is then patterned using the patterned hard mask structure as a mask to form trenches 402. Accordingly, the semiconductor fins 420 are formed.

Isolation structures 430, such as shallow trench isolations (STI), are disposed in the trenches 402 and over the substrate 410. The isolation structures 430 can be equivalently referred to as an isolation insulating layer in some embodiments. The isolation structures 430 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 430 are formed through a process such as CVD, flowable CVD (FCVD), or a spin-on-glass process, although any acceptable process may be utilized. Subsequently, portions of the isolation structures 430 extending over the top surfaces of the semiconductor fins 420, are removed using, for example, an etching back process, chemical mechanical polishing (CMP), or the like.

The isolation structures 430 are then recessed to expose an upper portion of the semiconductor fin 420. In some embodiments, the isolation structures 430 are recessed using a single etch processes, or multiple etch processes. In some embodiments in which the isolation structures 430 is made of silicon oxide, the etch process may be, for example, a dry etch, a chemical etch, or a wet cleaning process. For example, the chemical etch may employ fluorine-containing chemical such as dilute hydrofluoric (dHF) acid.

Figure 11:
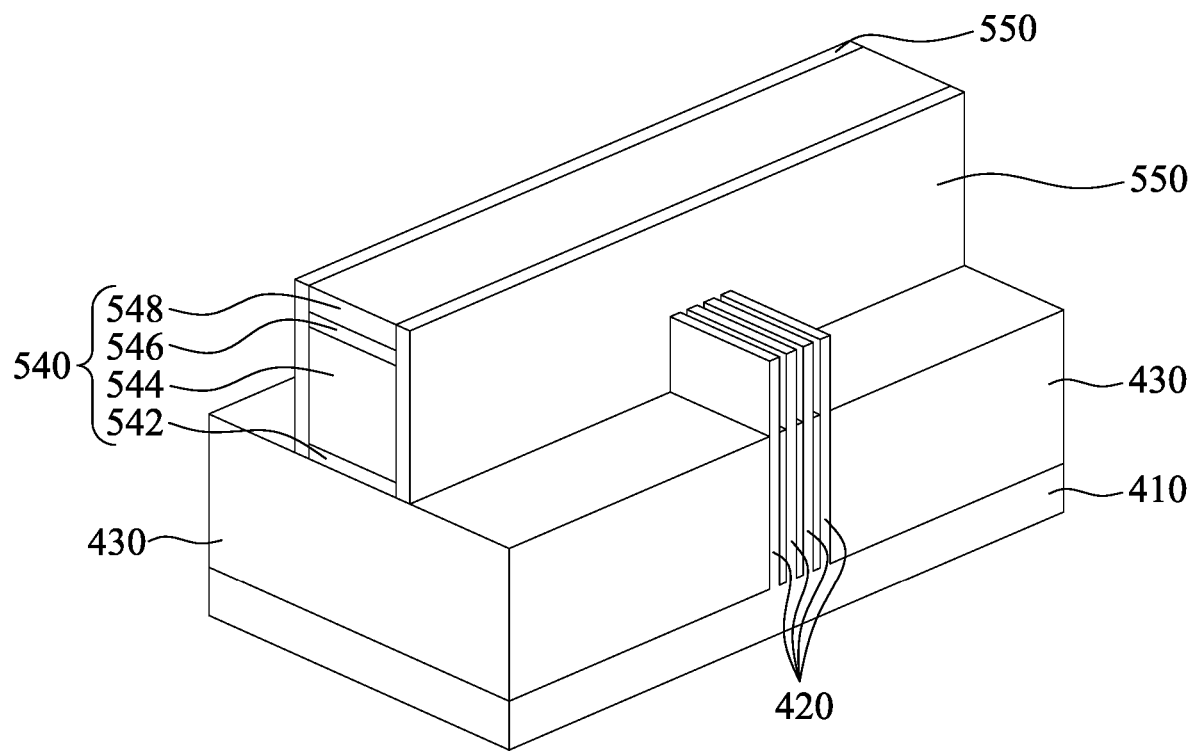

Reference is made to FIG. 11. After the semiconductor fins 420 and the isolation structures 430 are formed, at least one dummy gate structure 540 is formed over the substrate 410 and at least partially disposed over the semiconductor fins 420. The portions of the semiconductor fins 420 underlying the dummy gate structure 540 may be referred to as the channel regions C (see FIGS. 17C and 18C), and the semiconductor fins 420 may be referred to as channel layers. The dummy gate structure 540 may also define source/drain regions S/D (see FIGS. 17C and 18C) of the semiconductor fins 420, for example, the regions of the semiconductor fins 420 adjacent and on opposing sides of the channel regions C.

Dummy gate formation operation first forms a dummy gate dielectric layer over the semiconductor fins 420. Subsequently, a dummy gate electrode layer and a hard mask which may include multiple layers (e.g., an oxide layer and a nitride layer) are formed over the dummy gate dielectric layer. The hard mask is then patterned to be a nitride mask layer 548 and an oxide mask layer 546, followed by patterning the dummy gate electrode layer to be a dummy gate electrode 544 by using the nitride mask layer 548 and the oxide mask layer 546 as etch masks. In some embodiments, after patterning the dummy gate electrode layer, the dummy gate dielectric layer is removed from the S/D regions of the semiconductor fins 420 and to be a dummy gate dielectric layer 542. The etch process may include a wet etch, a dry etch, and/or combinations thereof. The etch process is chosen to selectively etch the dummy gate dielectric layer without substantially etching the semiconductor fins 420, the dummy gate electrode layer 544, the oxide mask layer 546, and the nitride mask layer 548.

In some embodiments, lightly-doped-drain (LDD) source/drain regions 414 and 416 (see FIG. 15C) are formed in the source/drain portions of the semiconductor fins 420. For example, at least one implantation process is performed, such that dopants are implanted in the source/drain portions of the semiconductor fins 420 to form the LDD source/drain regions 414 and 416. The dummy gate structure 540 act as a mask for the ion implantation.

After formation of the dummy gate structure 540 (or formation of the LDD source/drain regions 414 and 416) is completed, gate spacers 550 are formed on sidewalls of the dummy gate structure 540. In some embodiments of the gate spacer formation operations, a spacer material layer is deposited on the substrate 410. The spacer material layer may be a conformal layer that is subsequently etched back to form the gate spacers 550. In some embodiments, the spacer material layer includes multiple layers, such as a first spacer layer 552 and a second spacer layer 554 (see FIG. 15C) formed over the first spacer layer 552. The first and second spacer layers 552 and 554 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 552 and 554 may be formed by depositing in sequence two different dielectric materials over the dummy gate structure 540 using processes such as, an ALD process, a PEALD (plasma enhanced ALD) process, a PECVD process, a subatmospheric CVD (SACVD) process, or other suitable process. An anisotropic etching process is then performed on the first and second spacer layers 552 and 554 to expose portions of the semiconductor fins 420 not covered by the dummy gate structure 540 (e.g., in the source/drain regions of the semiconductor fins 420). Portions of the first and second spacer layers 552 and 554 directly above the dummy gate structure 540 may be removed by this anisotropic etching process. Portions of the first and second spacer layers 552 and 554 on sidewalls of the dummy gate structure 540 may remain, forming gate sidewall spacers, which are denoted as the gate spacers 550, for the sake of simplicity. In some embodiments, the first spacer layer 552 is formed of silicon oxide that has a lower dielectric constant than silicon nitride, and the second spacer layer 554 is formed of silicon nitride that has a higher etch resistance against subsequent etching processing (e.g., etching source/drain recesses in the semiconductor fins 420) than silicon oxide. In some embodiments, the gate spacers 550 may be used to offset subsequently formed doped regions, such as source/drain regions. The gate spacers 550 may further be used for designing or modifying the source/drain region profile.

Figure 12:
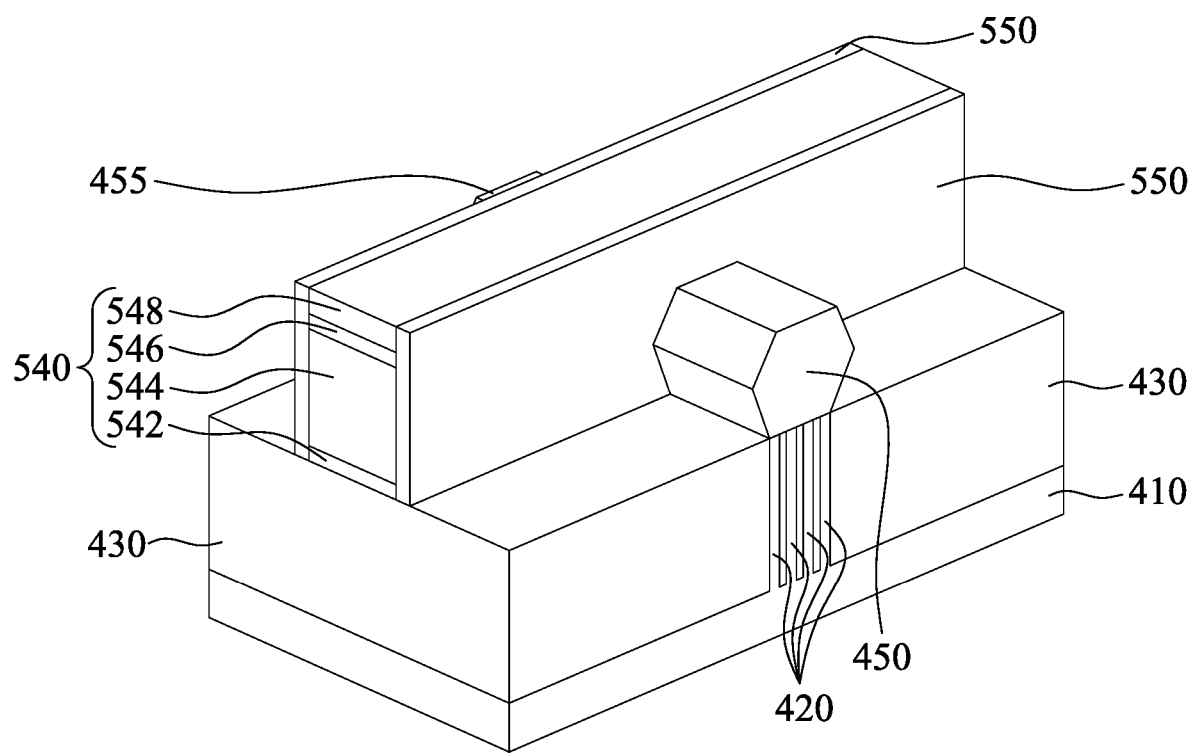

Reference is made to FIG. 12. After the formation of the gate spacers 550 is completed, source/drain epitaxial structures 450 and 455 are formed on source/drain regions of the semiconductor fins 420 that are not covered by the dummy gate structures 540 and the gate spacers 550. In some embodiments, formation of the source/drain epitaxial structures 450 and 455 includes recessing source/drain regions of the semiconductor fins 420, followed by epitaxially growing semiconductor materials in the recessed source/drain regions of the semiconductor fins 420.

The source/drain regions of the semiconductor fins 420 can be recessed using suitable selective etching processing that attacks the semiconductor fins 420, but barely attacks the gate spacers 550 and the mask layer 548 of the dummy gate structure 540. For example, recessing the semiconductor fins 420 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 420 at a faster etch rate than it etches the gate spacers 550 and the mask layer 548 of the dummy gate structure 540. In some other embodiments, recessing the semiconductor fin 420 may be performed by a wet chemical etch, such as ammonium peroxide mixture (APM), $NH_4OH$, tetramethylammonium hydroxide (TMAH), combinations thereof, or the like, which etches the semiconductor fins 420 at a faster etch rate than it etches the gate spacers 550 and the mask layer 548 of the dummy gate structure 540. In some other embodiments, recessing the semiconductor fins 420 may be performed by a combination of a dry chemical etch and a wet chemical etch.

Once recesses are created in the source/drain regions of the semiconductor fins 420, the source/drain epitaxial structures 450 and 455 are formed in the source/drain recesses in the semiconductor fins 420 by using one or more epitaxy or epitaxial (epi) processes that provides one or more epitaxial materials on the semiconductor fins 420. During the epitaxial growth process, the gate spacers 550 limit the one or more epitaxial materials to source/drain regions in the semiconductor fins 420. In some embodiments, the lattice constants of the source/drain epitaxial structures 450 and 455 are different from the lattice constant of the semiconductor fins 420, so that the channel region in the semiconductor fins 420 and between the source/drain epitaxial structures 450 and 455 can be strained or stressed by the source/drain epitaxial structures 450 and 455 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 420.

In some embodiments, the source/drain epitaxial structures 450 and 455 include Ge, Si, GaAs, AlGaAs, SiGe, GaAsP, SiP, or other suitable material. The source/drain epitaxial structures 450 and 455 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 450 and 455 are not in-situ doped, an implantation process (i.e., a junction implant process) is performed to dope the source/drain epitaxial structures 450 and 455. In some exemplary embodiments, the source/drain epitaxial structures 450 and 455 in an n-type transistor include SiP.

Once the source/drain epitaxial structures 450 and 455 are formed, an annealing process can be performed to activate the n-type dopants in the source/drain epitaxial structures 450 and 455. The annealing process may be, for example, a rapid thermal anneal (RTA), a laser anneal, a millisecond thermal annealing (MSA) process or the like.

Figure 13:
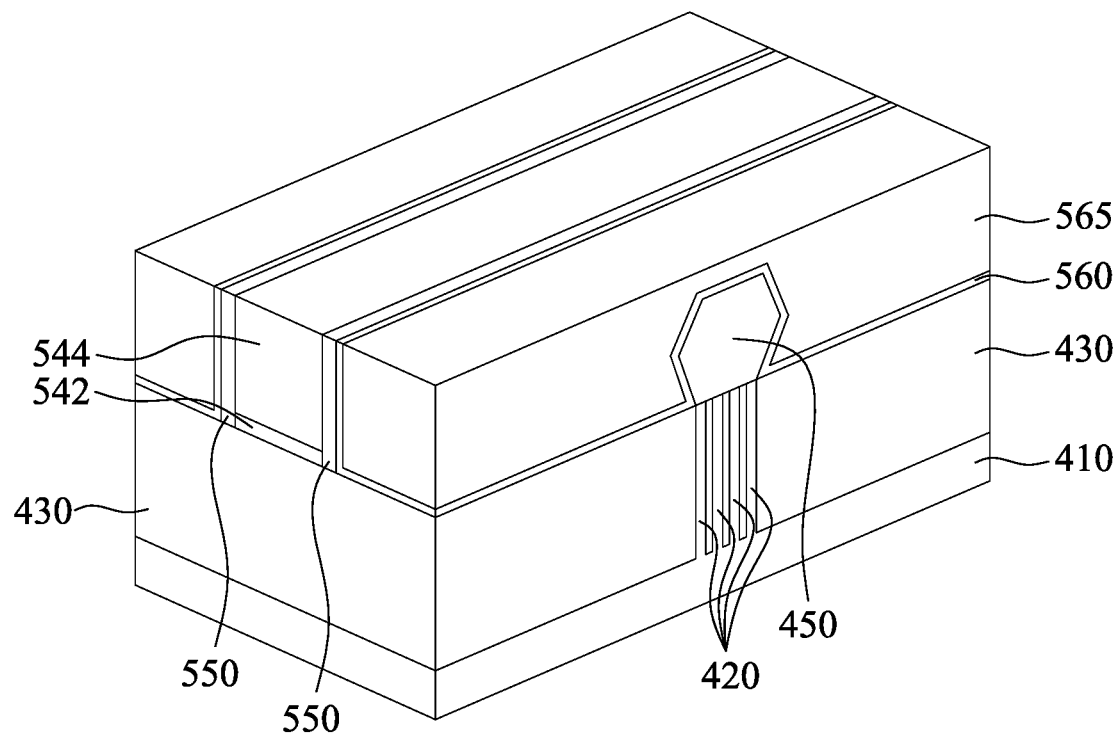

Reference is made to FIG. 13. An interlayer dielectric (ILD) layer 565 is formed on the substrate 410. In some embodiments, a contact etch stop layer (CESL) 560 is also formed prior to forming the ILD layer 565. In some embodiments, the CESL 560 includes a silicon nitride layer, a silicon oxynitride layer, and/or other suitable materials having a different etch selectivity than the ILD layer 565. The CESL 560 may be formed by plasma-enhanced chemical vapor deposition (PECVD) process and/or other suitable deposition or oxidation processes. In some embodiments, the ILD layer 565 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 560. The ILD layer 565 may be deposited by a subatmospheric CVD (SACVD) process, a flowable CVD process, or other suitable deposition technique. In some embodiments, after formation of the ILD layer 565, the wafer may be subject to a high thermal budget process to anneal the ILD layer 565.

In some examples, after forming the ILD layer 565, a planarization process may be performed to remove excessive materials of the ILD layer 565. For example, a planarization process includes a chemical mechanical planarization (CMP) process which removes portions of the ILD layer 565 (and the CESL 560, if present) overlying the dummy gate structure 540. In some embodiments, the CMP process also removes the oxide mask layer 546 and the nitride mask layer 548 (as shown in FIG. 12) and exposes the dummy gate electrode 544.

Figure 14:
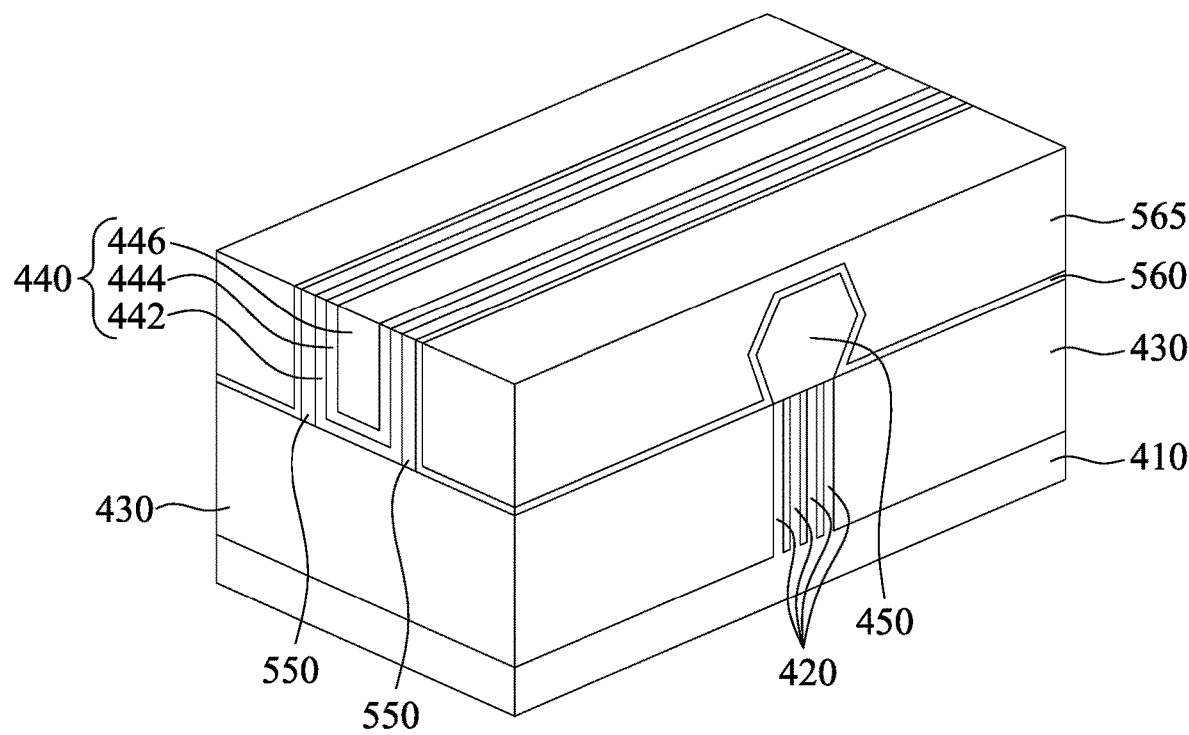

Reference is made to FIG. 14. The dummy gate electrode 544 and the dummy gate dielectric layer 542 (see FIG. 13) are removed, resulting in a gate trench between the gate spacers 550. The dummy gate electrode 544 and the dummy gate dielectric layer 542 are removed using a selective etching process (e.g., selective dry etching, selective wet etching, or combinations thereof) that etches materials in the dummy gate electrode 544 and the dummy gate dielectric layer 542 at a faster etch rate than it etches other materials (e.g., the gate spacers 550, the CESL 560, and/or the ILD layer 565).

Thereafter, a replacement gate structure 440 is formed in the gate trench. The gate structure 440 may be the final gates of FinFETs. The final gate structure may be a high-k/metal gate stack, however other compositions are possible. In some embodiments, the gate structure 440 forms the gate associated with the three-sides of the channel region provided by the semiconductor fins 420. Stated another way, the gate structure 440 wraps around the semiconductor fins 420 on three sides. In various embodiments, the (high-k/metal) gate structure 440 includes a gate dielectric layer 442 lining the gate trench and a gate electrode over the gate dielectric layer 442. The gate electrode may include a work function metal layer 444 formed over the gate dielectric layer 442 and a fill metal 446 formed over the work function metal layer 444 and filling a remainder of gate trenches. The gate dielectric layer 442 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 444 and/or fill metal 446 used within the high-k/metal gate structure 440 may include a metal, metal alloy, or metal silicide. Formation of the high-k/metal gate structure 440 may include multiple deposition processes to form various gate materials, one or more liner layers, and one or more CMP processes to remove excessive gate materials.

In some embodiments, the interfacial layer of the gate dielectric layer 442 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 442 may include hafnium oxide ($HfO_2$). Alternatively, the gate dielectric layer 442 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 444 may include work function metals to provide a suitable work function for the high-k/metal gate structure 440. For an n-type FinFET, the work function metal layer 444 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 446 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Reference is then made to FIGS. 15A-15C, where FIG. 15B is a cross-sectional view taken along line I-I of FIG. 15A, and FIG. 15C is a cross-sectional view taken along line II-II of FIG. 15A. One or more etching processes are performed to form contact openings O1, O2, O3, and O4 extending though the ILD layer 565 to expose the source/drain epitaxial structures 450, 455, or the isolation structures 430. For example, the contact openings O1 and O3 expose the isolation structures 430 as shown in FIG. 15B, and the contact openings O2 and O4 respectively expose the source/drain epitaxial structures 450 and 455 as shown in FIG. 15C. That is, the depths of the contact openings O1 and O3 are greater than the depths of the contact openings O2 and O4.

Reference is then made to FIGS. 16A-16C, where FIG. 16B is a cross-sectional view taken along line I-I of FIG. 16A, and FIG. 16C is a cross-sectional view taken along line II-II of FIG. 16A. Reading contacts 460 are respectively formed in the contact openings O1, sensing contacts 470 are respectively formed in the contact openings O3, and source/drain contacts 490 and 495 are respectively formed in the contact openings O2 and O4. Formation of the contacts includes, by way of example and not limitation, depositing one or more conductive materials overfilling the contact openings O1, O2, O3, and O4 such that the conductive materials are in contact with the isolation structure 430, and then performing a CMP process to remove excessive conductive materials outside the contact openings O1, O2, O3, and O4. As shown in FIG. 16B, a top surface 462 of the reading contact 460, a top surface 472 of the sensing contact 470, and a top surface 492 of the source/drain contact 490 are substantially coplanar.

In some embodiments, metal alloy layers 492 and 497 are respectively formed above the source/drain epitaxial structures 450 and 455 prior to forming the source/drain contacts 490 and 495. The metal alloy layers 492 and 497, which may be silicide layers, are respectively formed in the contact openings O2 and O4 and over the exposed source/drain epitaxial structures 450 and 455 by a self-aligned silicide (salicide) process. The silicide process converts the surface portions of the source/drain epitaxial structures 450 and 455 into the silicide contacts. Silicide processing involves deposition of a metal that undergoes a silicidation reaction with silicon (Si). In order to form silicide contacts on the source/drain epitaxial structures 450 and 455, a metal material is blanket deposited on the source/drain epitaxial structures 450 and 455. After heating the wafer to a temperature at which the metal reacts with the silicon of the source/drain epitaxial structures 450 and 455 to form contacts, unreacted metal is removed. The silicide contacts remain over the source/drain epitaxial structures 450 and 455, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 492 and 497 may include germanium.

Reference is then made to FIGS. 17A-17C, where FIG. 17B is a cross-sectional view taken along line I-I of FIG. 17A, and FIG. 17C is a cross-sectional view taken along line II-II of FIG. 17A. A multilayer interconnection (MLI) structure 570 is formed over the structure of FIG. 16A. The MLI structure 570 may include a plurality of metallization layers 572. The number of metallization layers 572 may vary according to design specifications of the semiconductor device. Eight metallization layers 572 are illustrated in FIGS. 17B and 17C for the sake of simplicity. The metallization layers 572 each includes an inter-metal dielectric (IMD) layer 573 and an etch stop layer 574. For clarity, the IMD layers 573 and the etch stop layers 574 are shown in FIGS. 17B and 17C and are omitted in FIG. 17A. The metallization layers 572 include one or more horizontal interconnects, such as a word line WL, a bit line BL, a ground line GND, and sensing pads 482, respectively extending horizontally or laterally in the IMD layers 573 and vertical interconnects, such as sensing vias 484 and conductive vias 486, respectively extending vertically in the IMD layers 573 and pass through the etch stop layers 574. As mentioned above, the sensing pads 482 and the sensing vias 484 form a sensing pad structure 480.

The word line WL, the bit line BL, the ground line GND, the sensing pads 482, the sensing vias 484, and the conductive vias 486 can be formed using, for example, a single damascene process, a dual damascene process, the like, or combinations thereof. In some embodiments, the IMD layers 573 may include low-k dielectric materials having k values, for example, lower than about 4.0 or even 2.0 disposed between such conductive features. In some embodiments, the IMD layers 573 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. In some embodiments, the etch stop layers 574 may be formed of $SiN_x$, SiCN, $SiO_2$, CN, $AlO_xN_y$, combinations thereof, or the like, deposited by CVD or PECVD techniques. The word line WL, the bit line BL, the ground line GND, the sensing pads 482, the sensing vias 484, and the conductive vias 486 may include metal materials such as copper, aluminum, tungsten, combinations thereof, or the like. In some embodiments, the word line WL, the bit line BL, the ground line GND, the sensing pads 482, the sensing vias 484, and the conductive vias 486 may further include one or more barrier/adhesion layers (not shown) to protect the respective IMD layers 573 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. As shown in FIG. 17C, there is no via interconnecting the horizontal interconnects and/or vertical interconnects of the MLI structure 570 and the gate structure 440.

Figure 18A:
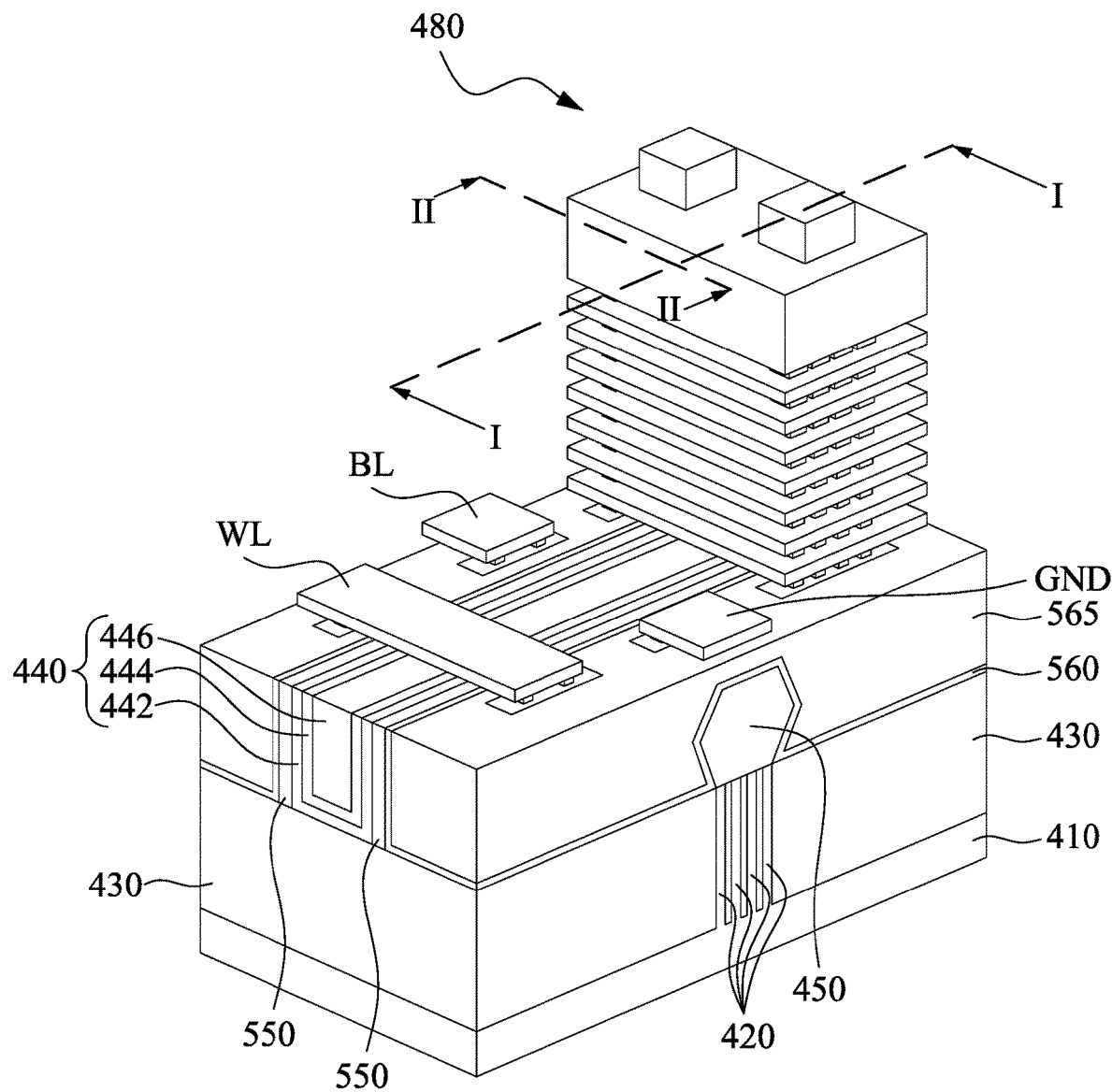
FIG. 18A is a perspective view of a semiconductor detector in accordance with some embodiments.
Figure 18B:
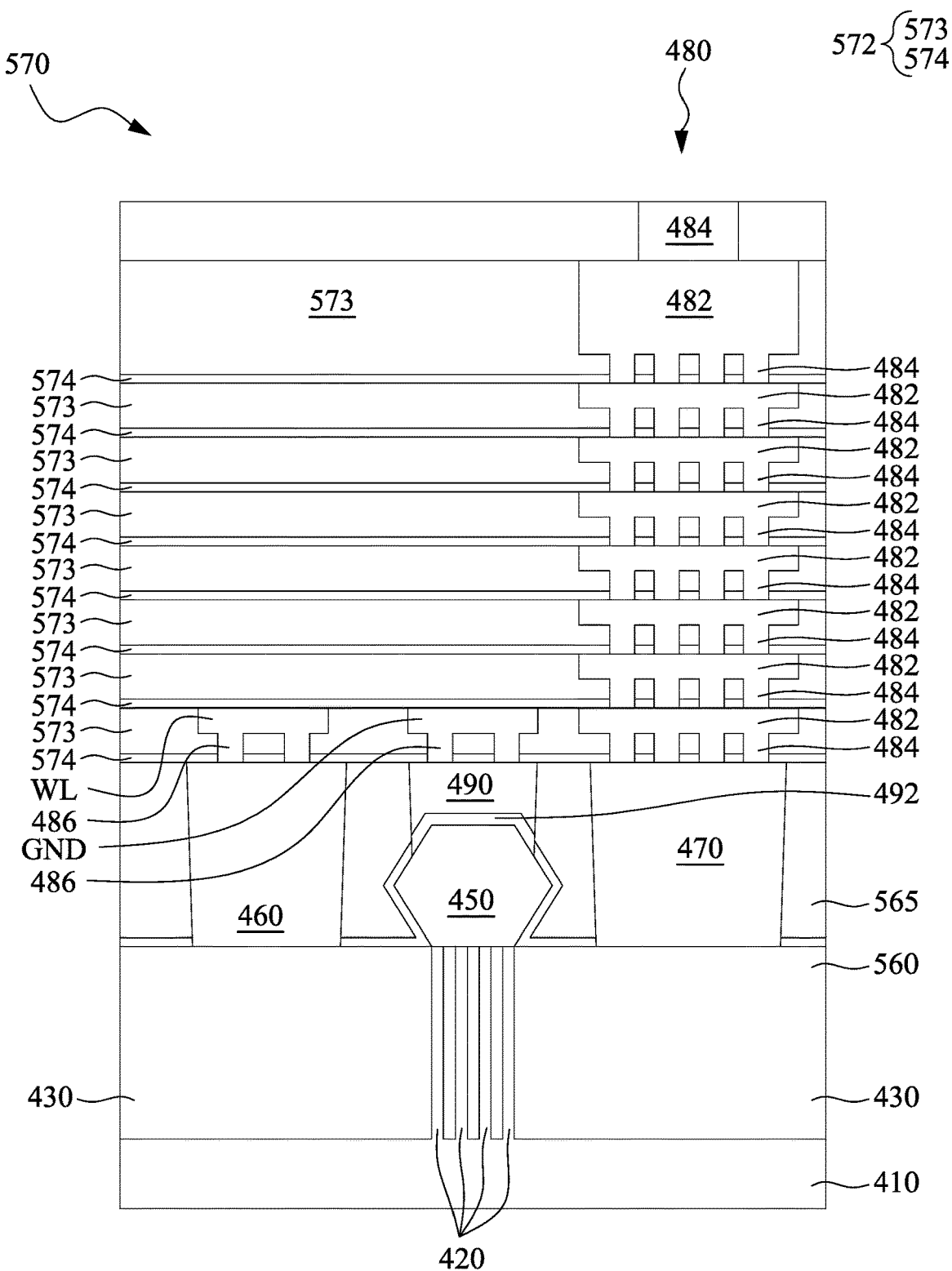
FIG. 18B is a cross-sectional view taken along line I-I of FIG. 18A.
Figure 18C:
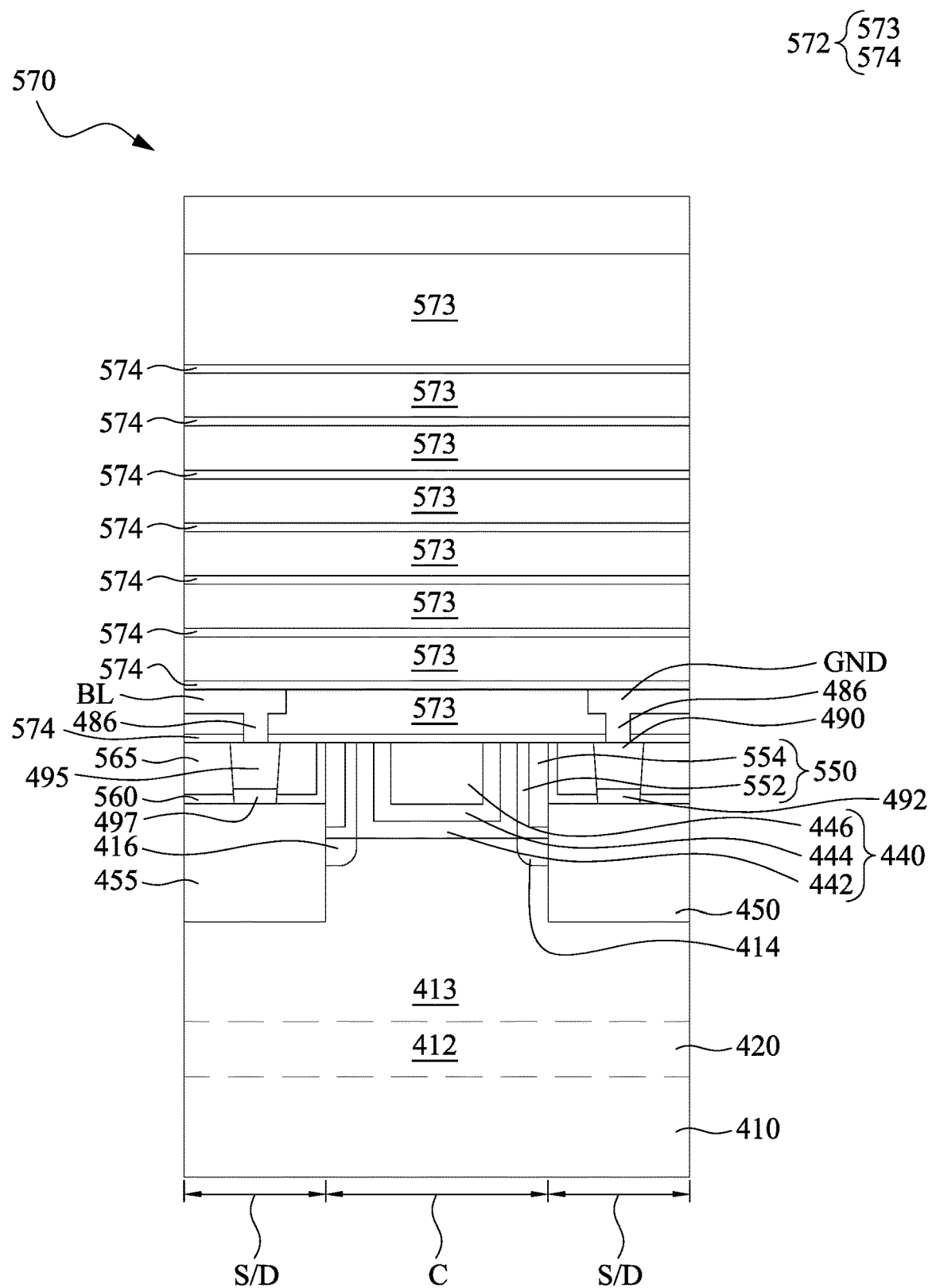
FIG. 18C is a cross-sectional view taken along line II-II of FIG. 18A.

FIG. 18A is a perspective view of a semiconductor detector in accordance with some embodiments, FIG. 18B is a cross-sectional view taken along line I-I of FIG. 18A, and FIG. 18C is a cross-sectional view taken along line II-II of FIG. 18A. The difference between the semiconductor detectors in FIGS. 18A-18C and FIGS. 17A-17C pertains to the conductivity type of the semiconductor detectors. For example, the semiconductor detector in FIGS. 17A-17C uses an NMOS configuration, and the semiconductor detector in FIGS. 18A-18C uses a PMOS configuration. Specifically, in FIG. 18C, a P-well 412 is formed in the substrate 410, and an N-well 413 is formed in the P-well 412. The source/drain epitaxial structures 450 and 455 are P-type and formed in the N-well 413.

In some embodiments, the source/drain epitaxial structures 450 and 455 include Ge, Si, GaAs, AlGaAs, SiGe, GaAsP, SiP, or other suitable material. The source/drain epitaxial structures 450 and 455 may be in-situ doped during the epitaxial process by introducing doping species including: p-type dopants, such as boron or $BF_2$ and/or other suitable dopants including combinations thereof. If the source/drain epitaxial structures 450 and 455 are not in-situ doped, an implantation process (i.e., a junction implant process) is performed to dope the source/drain epitaxial structures 450 and 455. In some exemplary embodiments, the source/drain epitaxial structures 450 and 455 in a p-type include GeSnB and/or SiGeSnB.

The work function metal layer 444 may include work function metals to provide a suitable work function for the high-k/metal gate structures 442. For a p-type FinFET, the work function metal layer 444 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. Other relevant structural details of the semiconductor detector in FIGS. 18A-18C are the same as or similar to the semiconductor detector in FIGS. 17A-17C, and, therefore, a description in this regard will not be repeated hereinafter.

FIG. 19 is a schematic diagram of an electron beam system 700 for implementing one or more embodiments of the present disclosure. The electron beam lithography system includes a chamber 710, an electron source 720, an electron optical module 730, a wafer stage 740, a pump unit 750, and a modulator 760 according to one or more embodiments of the present disclosure. However, other configurations and inclusion or omission of devices may be possible. In some embodiments, the electron beam system 700 is an electron beam writer or a scanning electron microscope. The electron source 720 is disposed in the chamber 710 and provides electrons (i.e., the electron beam 722) emitted from a conducting material by heating conducting material s to a very high temperature, where the electrons have sufficient energy to overcome the work function barrier and escape from the conducting material (thermionic sources), or by applying an electric field sufficiently strong that the electron tunnel through the barrier (field emission sources). The electron optical module 730 is disposed in the chamber 710 and includes electromagnetic apertures 732, electrostatic (and/or electromagnetic) lenses 734, shaping deflector, and/or cell selection deflector; and provides a plurality of Gaussian spot electron beams, variable shaped electron beams and cell projection electron beams. The chamber 710 includes a wafer loading and unloading unit, and provides the wafer transportation without interrupting the vacuum of the system. The pump unit 750 includes one or more pumps and provides a high vacuum environment for the electron beam system 700. The wafer stage 740 is disposed in the chamber 710 and includes motors, roller guides, and/or tables, and provides an accurate position and movement for a wafer W, secured on the wafer stage 740 by vacuum, in X, Y and Z directions during focus, leveling, exposure process of the wafer in the electron beam system 700. The modulator 760 is configured to blank, pulse, or modulating the electron beam 722.

FIG. 20 is a flowchart of a method M10 for detecting light uniformity of e-beam according to aspects of the present disclosure in various embodiments. The method M10 is merely an example and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Various operations of the method M10 are discussed in association with cross-section diagrams FIGS. 2-5. Throughout the various views and illustrative embodiments, like reference numbers are used to designate like elements. In operation S12 of FIG. 20, the detector units of the semiconductor detector are initialized. For example, each of the gate structures of the detector units is performed with the programming process (FIG. 3). That is, the electrons are injected into the gate structures of the detector units. With the programming process, the electrons in the gate structures of the detector units may be in saturation states after the initialization process. The programming process of the detector units is described in FIG. 3. Alternatively, each of the gate structures of the detector units is performed with the erasing process (FIG. 4). That is, the electrons are extracted out of the gate structures of the detector units. With the erasing process, the gate structures of the detector units may be substantially free of electrons after the initialization (erasing) process. The erasing process of the detector units is described in FIG. 4.

In operation S14 of FIG. 20, a pre-exposure reading operation is performed. For example, a wafer acceptance test (WAT) is performed on product wafers which are going to carry on exposure processes. The wafer acceptance test includes numerous testing items and is a part of IC fabrication process. The wafer acceptance test is used to determine product quality. During the wafer acceptance test, the semiconductor detector (e.g., the semiconductor detector 100 in FIG. 1, the semiconductor detector 200 in FIG. 7, or the semiconductor detector 300 in FIG. 9) is initialized and then the data of the gate structures of the detector units of the semiconductor detector is read by performing the process described in FIG. 5. In some embodiments, the line 12 in FIG. 6 is the data obtained from the pre-exposure reading operation.

In operation S16 of FIG. 20, a sensing operation is performed to the semiconductor detector. In some embodiments, the semiconductor detector is positioned on a wafer stage of an exposure apparatus (e.g., the wafer stage 740 of the electron beam system 700 shown in FIG. 19). The electron source 720 of the electron beam system 700 is turned on, and the electron beam 722 is incident or impinges or illuminates or projects on the semiconductor detector. The sensing pad structure of the detector units of the semiconductor detector sense the e-beam, and amounts of the electrons in the gate structures are changed. The sensing operation is described in FIG. 2.

In operation S18 of FIG. 20, a post-exposure reading operation is performed. For example, another wafer acceptance test (WAT) is performed on the semiconductor detector. During the wafer acceptance test, the data of the gate structure of each of the detector units of the semiconductor detector is read again by performing the process described in FIG. 5. In FIG. 6, the lines 14, 16, and 18 shows the I-V curve of the gate structure (under different e-beam intensities) after the e-beam sensing operation.

In operation S20 of FIG. 20, data of the pre-exposure reading operation and the post-exposure reading operation are compared to obtain intensity. Specifically, by comparison the I-V curves of the pre- and post-exposure reading operations, the electron variation of each gate can be determined, and the corresponding spatial e-beam intensity can be obtained.

In operation S22 of FIG. 20, the e-beam distribution of the electron beam system 700 is adjusted based on the compared data. Specifically, the spatial distribution of the e-beam of the semiconductor detector is obtained in the operation S20. If the spatial distribution is not desired (such as non-uniform), parameters of the electron beam system 700 are tuned to form an e-beam having more uniform spatial distribution. For example, the parameters are e-beam dosage.

In operation S24 of FIG. 20, product wafers are processed by using the adjusted e-beam. For example, the product wafers can be disposed on the wafer stage 740 of the electron beam system 700 shown in FIG. 19. The product wafers each include a photoresist, which can be exposed by the adjusted e-beam. The photoresist can then be developed and a patterned photoresist is formed. With the embodiments of the method M10, the patterning quality of the photoresists is improved.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the semiconductor detector is powerless during the sensing mode. Another advantage is that the sensing and recording of the e-beam intensity are in the same element (i.e., the floating gates), and an additional recorder can be omitted to save the layout area. In addition, there are only one transistor in a cell unit to achieve high density and high spatial resolution. Further, the manufacturing of the semiconductor detector is compatibility to semiconductor device (e.g., CMOS) process. For example, the semiconductor detector can be formed on a semiconductor wafer, such that the semiconductor detector can reflect the intensity distribution of the e-beam on a product wafer. Also, the data in the floating gate can be readout with (in-line) wafer acceptance tests, and the data can be timely feedback to adjust the e-beam intensity.

According to some embodiments, a device includes a semiconductor fin, an isolation structure, a gate structure, source/drain structures, a sensing contact, a sensing pad structure, and a reading contact. The semiconductor fin includes a channel region and source/drain regions on opposite sides of the channel region. The isolation structure laterally surrounds the semiconductor fin. The gate structure is over the channel region of the semiconductor fin. The source/drain structures are respectively over the source/drain regions of the semiconductor fin. The sensing contact is directly on the isolation structure and adjacent to the gate structure. The sensing pad structure is connected to the sensing contact. The reading contact is directly on the isolation structure and adjacent to the gate structure.

According to some embodiments, a method includes forming an isolation structure over a substrate to define an active region in the substrate. A gate structure is formed over the active region. Source/drain structures are formed on the active region and on opposite sides of the gate structure. An interlayer dielectric (ILD) layer is deposited over the substrate and surrounding the gate structure. A first opening, a second opening, and a third opening are formed in the ILD layer, such that the first opening exposes the active region, and the second and third openings expose the isolation structure. A source/drain contact is formed in the first opening, a reading contact is formed in the second opening, and a sensing contact is formed in the third opening. An interconnect structure is formed over the gate structure and the sensing contact. The interconnect structure includes a sensing pad connected to the sensing contact.

According to some embodiments, a method includes initializing an electrical potential of a gate structure of a semiconductor detector. The semiconductor detector includes the gate structure, an isolation structure, a reading contact, a sensing contact, and a sensing pad. The gate structure is over a semiconductor fin. The isolation structure surrounds the semiconductor fin. The reading contact is over the isolation structure and adjacent to the gate structure. The sensing contact is over the isolation structure and adjacent to the gate structure. The sensing pad is over and connected to the sensing contact. A pre-exposure reading operation is performed on the semiconductor detector. An e-beam light is projected to the sensing pad of the semiconductor detector after initializing the electrical potential of the gate structure of the semiconductor detector. A post-exposure reading operation is performed on the semiconductor detector. The data of the pre-exposure reading operation is compared with the post-exposure reading operation. An intensity of the e-beam light is adjusted based on the compared data of the pre-exposure reading operation and the post-exposure reading operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor fin comprising a channel region and source/drain regions on opposite sides of the channel region;
   an isolation structure laterally surrounding the semiconductor fin;
   a gate structure over the channel region of the semiconductor fin;
   source/drain structures respectively over the source/drain regions of the semiconductor fin;
   a sensing contact directly on the isolation structure and adjacent to the gate structure;
   a sensing pad structure connected to the sensing contact; and
   a reading contact directly on the isolation structure and adjacent to the gate structure, wherein a distance between the gate structure and the reading contact is less than a width of one of the source/drain structures.

2. The device of claim 1, wherein one of the source/drain structures is between the sensing contact and the reading contact.

3. The device of claim 1, wherein the reading contact is spaced apart from the semiconductor fin.

4. The device of claim 1, wherein the isolation structure is in contact with the reading contact and the semiconductor fin.

5. The device of claim 1, further comprising a source/drain contact connected to one of the source/drain structures, and a top surface of the source/drain contact is substantially coplanar with a top surface of the reading contact.

6. The device of claim 1, wherein the sensing contact is spaced apart from the semiconductor fin.

7. The device of claim 1, wherein the isolation structure is in contact with the sensing contact and the semiconductor fin.

8. The device of claim 1, further comprising a source/drain contact connected to one of the source/drain structures, and a top surface of the source/drain contact is substantially coplanar with a top surface of the sensing contact.

9. The device of claim 1, further comprising a word line connected to the reading contact.

10. The device of claim 1, wherein a bottom surface of the sensing contact is lower than a top surface of the gate structure.

11. The device of claim 1, further comprising an interlayer dielectric (ILD) layer over the isolation structure and laterally surrounding the gate structure and the sensing contact.

12. The device of claim 1, wherein a bottom surface of the sensing contact is lower than top surfaces of the source/drain structures.

13. A method comprising:
forming an isolation structure over a substrate to define an active region in the substrate;
forming a gate structure over the active region;
forming source/drain structures on the active region and on opposite sides of the gate structure;
depositing an interlayer dielectric (ILD) layer over the substrate and surrounding the gate structure;
forming a first opening, a second opening, and a third opening in the ILD layer, such that the first opening exposes the active region, and the second and third openings expose the isolation structure, and a depth of the first opening is greater than a depth of the second opening;
forming a source/drain contact in the first opening, a reading contact in the second opening, and a sensing contact in the third opening; and
forming an interconnection structure over the gate structure and the sensing contact, wherein the interconnection structure comprises a sensing pad connected to the sensing contact.

14. The method of claim 13, wherein forming the source/drain contact in the first opening, the reading contact in the second opening, and the sensing contact in the third opening comprises:
filling conductive materials in the first opening, the second opening, and the third opening of the ILD layer such that the conductive materials is in contact with the isolation structure; and
removing excessive portions of the conductive materials outside the first opening, the second opening, and the third opening of the ILD layer to form the source/drain contact, the reading contact, and the sensing contact.

15. The method of claim 13, wherein forming the interconnection structure over the gate structure and the sensing contact is such that there is no via interconnecting the interconnection structure and the gate structure.

16. The method of claim 13, wherein the interconnection structure further comprises a word line connected to the reading contact and is electrically isolated from the gate structure.

17. A method, comprising:
initializing an electrical potential of a gate structure of a semiconductor detector, wherein the semiconductor detector comprises:
the gate structure over a semiconductor fin;
an isolation structure surrounding the semiconductor fin;
a reading contact over the isolation structure and adjacent to the gate structure;
a sensing contact over the isolation structure and adjacent to the gate structure; and
a sensing pad over and connected to the sensing contact;
performing a pre-exposure reading operation on the semiconductor detector;
projecting an e-beam light to the sensing pad of the semiconductor detector after initializing the electrical potential of the gate structure of the semiconductor detector;
performing a post-exposure reading operation on the semiconductor detector, comprising obtaining a current-versus-voltage curve between the reading contact and a drain of the semiconductor detector;
comparing data of the pre-exposure reading operation with the post-exposure reading operation; and
adjusting an intensity of the e-beam light based on the compared data of the pre-exposure reading operation and the post-exposure reading operation.

18. The method of claim 17, wherein no power is applied to the semiconductor detector during projecting the e-beam light to the sensing pad of the semiconductor detector.

19. The method of claim 17, wherein initializing the electrical potential of the gate structure of the semiconductor detector comprises:
applying a positive voltage to the reading contact; and
applying a negative voltage to a drain of the semiconductor detector, wherein the positive voltage has a value greater than a value of the negative voltage, and the gate structure is floating during initializing the electrical potential of the gate structure of the semiconductor detector.

20. The method of claim 17, wherein initializing the electrical potential of the gate structure of the semiconductor detector comprises:
applying a negative voltage to the reading contact; and
applying a positive voltage to a drain of the semiconductor detector, wherein the negative voltage has a value greater than a value of the positive voltage, and the gate structure is floating during initializing the electrical potential of the gate structure of the semiconductor detector.

* * * * *